US 6,744,266 B2
Jun. 1, 2004

(12) United States Patent
Dor et al.

(54) DEFECT KNOWLEDGE LIBRARY

(75) Inventors: Amos Dor, Sunnyvale, CA (US); Maya Radzinski, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 155 days.

(21) Appl. No.: 09/905,609

(22) Filed: Jul. 13, 2001

(65) Prior Publication Data
US 2002/0072162 A1 Jun. 13, 2002

Related U.S. Application Data
(60) Provisional application No. 60/237,297, filed on Oct. 2, 2000.

(51) Int. Cl.⁷ .......................................... G01R 31/305
(52) U.S. Cl. ....................................................... 324/751
(58) Field of Search ........................... 438/14; 364/578; 324/751

(56) References Cited

U.S. PATENT DOCUMENTS

| 5,539,752 | A | | 7/1996 | Berezin et al. | 371/22.1 |
| 5,544,256 | A | | 8/1996 | Brecher et al. | 382/149 |
| 5,598,341 | A | | 1/1997 | Ling et al. | 364/468.17 |
| 5,761,064 | A | | 6/1998 | La et al. | 364/468.17 |
| 5,774,222 | A | | 6/1998 | Maeda et al. | 356/394 |
| 5,862,055 | A | | 1/1999 | Chen et al. | 364/468.28 |
| 5,886,909 | A | * | 3/1999 | Milor | 364/578 |
| 5,923,430 | A | | 7/1999 | Worster et al. | 356/394 |
| 5,949,901 | A | | 9/1999 | Nichani et al. | 382/149 |
| 5,959,459 | A | | 9/1999 | Satya et al. | 324/751 |
| 5,966,459 | A | | 10/1999 | Chen et al. | 382/149 |
| 6,016,562 | A | | 1/2000 | Miyazaki et al. | 714/724 |
| 6,167,448 | A | | 12/2000 | Hemphill et al. | 709/224 |
| 6,232,787 | B1 | * | 5/2001 | Lo | 324/751 |

FOREIGN PATENT DOCUMENTS

| EP | 0 910 123 A1 | 4/1999 | H01L/21/66 |
| WO | WO 99/59200 | 11/1999 | H01L/21/66 |
| WO | WO 00/54151 | 9/2000 | G06F/9/46 |

* cited by examiner

Primary Examiner—John F. Niebling
Assistant Examiner—André C Stephenson
(74) Attorney, Agent, or Firm—Moser Patterson & Sheridan, LLP

(57) ABSTRACT

A method and associated apparatus for creating a defect knowledge library containing case study information of wafer defects on semiconductor wafers. The method comprises creating a database entry that contains a case study of a specific defect including defect information that comprises one or more defect images and storing the database entry for subsequent access. The database entries are stored on a server and are accessible by a plurality of clients.

22 Claims, 15 Drawing Sheets

| | | |
|---|---|---|
| INTERNET BROWSER | | _ □ X |
| FILE  EDIT  VIEW  FAVORITES  HELP | | |
| ○ http:// | | |
| Defect Knowledge Library | | |
| | Browse  Search  Edit  Create  Image Gallery  Configuration | |
| | 702  704  706  708  710  712 | |

Case List | Tool | Defect

● Search Criteria: CASE
● Search by Case ID
Case ID [    ]
○ Search by Case Criteria
Case: [    ]
Name: [    ]
Case: [    ]
State: [All ▼]
Creation: ● From First  ● To Last
Date: ○ Start Date [    ]  ○ End Date [    ]
Key: [    ]
Words:
Author: [All ▼]
Message: [All ▼]
Site: [All ▼]
Company: [All ▼]

Matches Found: 56  Total Number of Pages: 2  Current Page Number 1
Case State Legend: New Open Completed Obsolete

| Case# | Case Name | Created Date |
|---|---|---|
| 1 | Test | 12/8/99 |
| 2 | Name 1 | 12/8/99 |
| 3 | Name 2 | 12/8/99 |
| 4 | Name 3 | 12/8/99 |
| 5 | Name 4 | 12/8/99 |
| 222 | Name 5 | 12/8/99 |
| 7 | Name 6 | 12/8/99 |
| 8 | Name 7 | 12/10/99 |
| 9 | Name 8 | 12/11/99 |
| 10 | Name 9 | 12/11/99 |
| 11 | Name 10 | 12/14/99 |
| 12 | Name 11 | 12/17/99 |
| 13 | Name 12 | 12/17/99 |
| 14 | Name 13 | 12/18/99 |
| 15 | Name 14 | 12/18/99 |
| 16 | Name 15 | 12/21/99 |
| 17 | Name 16 | 12/21/99 |
| 19 | Name 17 | 12/21/99 |
| 20 | Name 18 | 12/21/99 |
| 21 | Name 19 | 12/21/99 |

Next Page

Search | New Search | View Criteria | Reset Tab

Fig. 9

| | |
|---|---|
| Tool Types: | Etch1, Etch2 |
| Platforms: | Centura |
| Chamber Types: | Branch |
| Process Name: | atu |
| Type of Cleaning: | Dry Clean |
| Process Step: | |
| Gases: | Br2, F, N2 |

| | |
|---|---|
| Case Name: | A1P Particles due to oxide etch |
| Problems: | Etch process recipe results in high number of particles |
| Root Cause: | Exposure of aluminum bead pads .... to over-etching |
| Corrective Action: | Modified etch recipe (recipe details not recorded) |
| Recommendation: | |
| Case Author: | Mr. Smith |

Fig. 10

DEFECT KNOWLEDGE LIBRARY

CROSS REFERENCE TO RELATED APPLICATION

This application claims benefit of United States provisional patent application serial number 60/237,297, filed Oct. 2, 2000, which is herein incorporated by reference. This application contains subject matter that is related to the subject matter described in US patent application Ser. Nos. 09/905,313, 09/905,514 and 09/905,607, filed simultaneously herewith on Jul. 13, 2001, which are each incorporated herein by reference in their entireties.

BACKGROUND OF THE INVENTION

1. Field of the Invention

The present invention generally relates to a method or associated apparatus for performing defect analysis in a semiconductor wafer processing system. More particularly, the invention relates to a database that stores images and other information relating to defects on semiconductor wafers.

2. Description of the Related Art

Semiconductor wafers are prone to defects that occur during processing. Defects may occur at any stage of the processing of the wafers as integrated circuits are formed thereupon. Generally each fabricator of integrated circuits maintains a database of the causes of defects that occur on a regular basis. If the defect occurs frequently and a solution is apparent, the database may contain a description of the defect, the defect's cause, and the solution to the defect. For example, certain defects may occur when a particular chamber becomes dirty. When these defects occur, the database would indicate the solution to be to execute a cleaning cycle for the particular chamber.

The various integrated circuit fabricators develop their own proprietary databases of defect information. As such, substantial funds are expended to produce the databases that include a complete listing of possible defects and solutions over time.

Therefore, there is a need in the art for a method for pooling the confidential defect information of multiple integrated circuit fabricators. This defect information could be accessed by various fabricators in a manner that would not reveal any confidential processing information. The combined defect information could be organized so that the analysis of the source or cause of a wafer defect can be correlated with the proper solution to the defect.

SUMMARY OF THE INVENTION

The present invention is a method and apparatus for creating a database comprising images and other semiconductor wafer defect information. The database is stored in a server having a plurality of clients connected thereto. The images and other information are supplied to the database from the clients. The clients collect the information and images from local metrology cells, then transmit the information and images via a network to the server. The information and images are organized in the database with associated causes and solutions for the defects to form a case study for each defect. The defect case studies may be pooled from a plurality of clients to form a comprehensive defect knowledge library. Any of the clients, if authorized, may remotely access the database to find the cause and solution for specific defects.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

FIG. 8 shows a search screen that may be displayed by the defect knowledge library database system of FIG. 3;

FIG. 9 shows a browse defect screen that may be displayed by the defect knowledge library database system of FIG. 3;

FIG. 10 shows an edit screen that may be displayed by the defect knowledge library database system of FIG. 3;

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
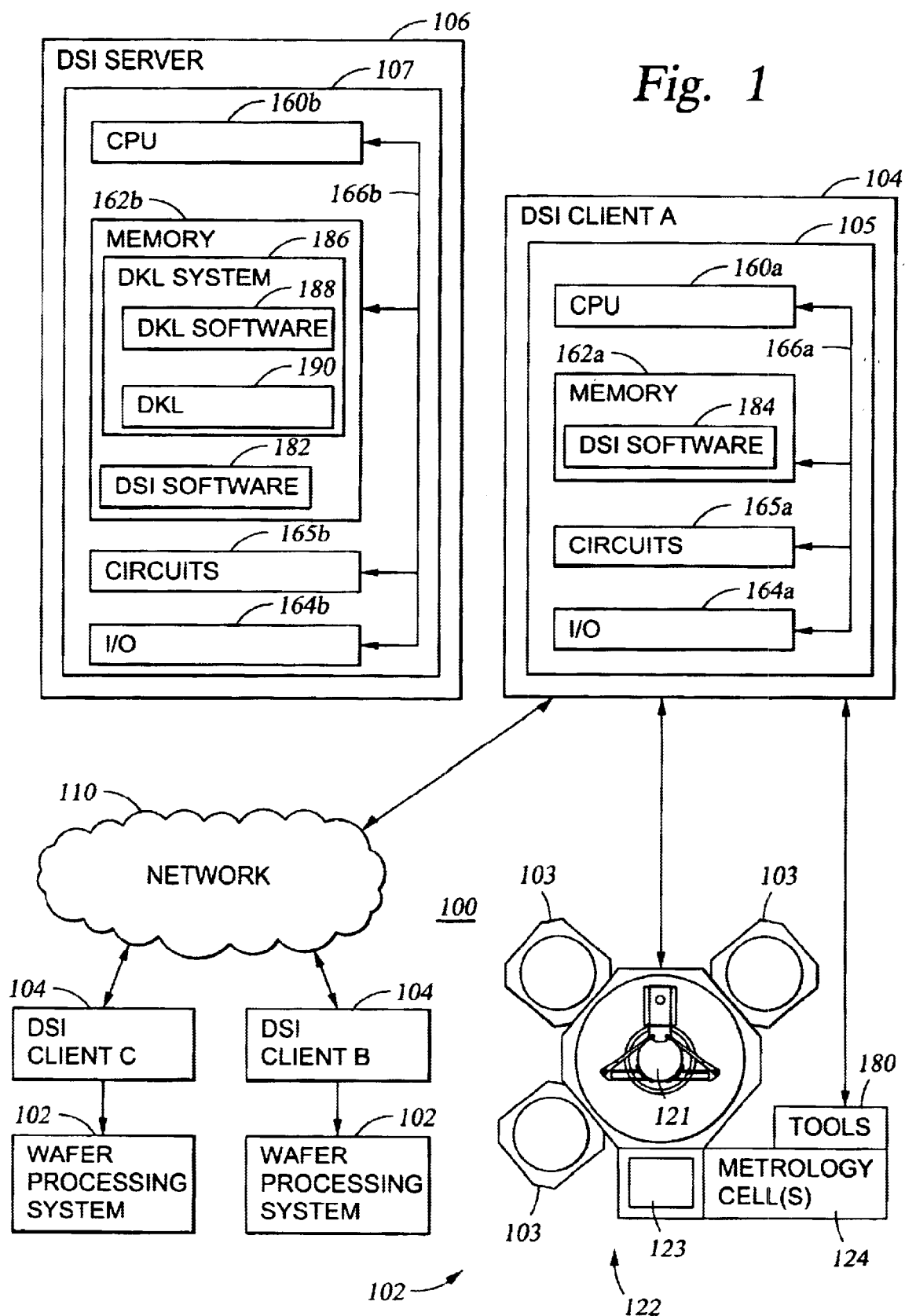
FIG. 1 shows a block diagram of a defect source identifier arranged in accordance with the present invention.

One embodiment of a defect knowledge library system 186 forms a portion of a defect source identifier 100 shown in FIG. 1. The defect source identifier 100 identifies defects in the wafers processed by a wafer processing system 102, determines the sources of the defects and suggests solutions to mitigate each of the defects. The wafer processing system 102 includes one or more process cells 103. Each one of the process cells 103 (also referred to herein as processing tools) is configured to perform such exemplary processes on wafers as chemical vapor deposition (CVD), physical vapor deposition (PVD), electrochemical plating (ECP), chemical mechanical polishing (CMP), electroless deposition, other known deposition, or etching processes.

The defect knowledge library (DKL) database system 186 stores semiconductor wafer defect case histories in a DKL database 190. The case history information is stored, organized and accessed by DKL software 188. Such semiconductor wafer defect case histories can be accessed by remote users (clients 104) of the defect source identifier 100 to determine a source of as well as a solution to wafer defects that are identified by the defect source identifier 100.

The defect source identifier 100 includes, and utilizes the output from, metrology tools 180 that analyze wafer defects that have occurred during processing within the wafer processing system 102. Certain embodiments of the defect source identifier 100 transfer wafer data, images, and/or information relating to the wafer defects to a remote location for analysis. The defect source identifier 100 compares wafer images to case histories of wafer defects, perform spectral analysis on the wafer data, and then transmits defect sources and operational solutions to those defects to the wafer processing system (or to an operator located at the wafer processing system).

The term "wafer" includes semiconductor wafers or some other form of substrate upon which sequential process steps are performed. The embodiment of defect source identifier 100 shown in FIG. I includes a wafer processing system 102, one or more defect source identifier clients 104, one or more defect source identifier servers 106, and a network 110. The wafer processing system 102 includes a transfer cell 120, a plurality of process cells 103, a wafer transfer system 121 (also referred to as a robot), and a factory interface 122.

The factory interface 122 includes a cassette load lock 123, at least one metrology cell 124, and metrology tools 180. The metrology cell(s) 124 and tools 180 may be connected to the system 102 or may be a standalone station or stations. The cassette load lock 123 stores one or more wafers. The metrology tools 180 are operatively connected to the metrology cell 124. The metrology tools 180 measure and test wafer characteristics and wafer defects. The metrology tools 180 may include, e.g., a scanning or transmission electron microscope, an optical wafer defect inspection system, spatial signature analysis tools, or any other tool used to analyze defects of wafers.

A plurality of defect source identifier clients 104 are shown in the embodiment of FIG. 1 as defect source identifier clients A, B, and C. The following description references the details of defect source identifier client A, but is representative of all defect source identifier clients. Each defect source identifier client 104 includes a client computer 105 to control the operation of both the wafer processing system 102 and the individual process cells 103 in the wafer processing system 102. The defect source identifier server 106 includes the server computer 107.

The client computer 105 interacts with the server computer 107 via network 110 to receive data stored in server computer 107. The client computer 105 and the server computer 107 may store present and historical (i.e., case study) defects on wafers processed by the wafer processing system 102. As such, the client computer 105 and the server computer 107 interact with the metrology tools 180 of the metrology cell 124, and a variety of databases, to store wafer defect case histories that facilitate analysis of wafer defects.

The network 110 provides data communications between the client computer 105 and the server computer 107. The network 110 may utilize the Internet, an intranet, a wide area network (WAN), or any other form of a network. It is envisioned that the network 110 may utilize such computer languages utilized by such networks as the Internet as Hypertext Markup Language (HTML) or extensible Markup Language (XML). HTML is presently the predominant markup language utilized by the Internet while XML is a markup language that is gaining greater acceptance in the Internet. The use of HTML and/or XML requires the use of a respective HTML and/or XML browser installed at each client computer 105.

The defect source identifier client 104 and the server 106 interact to determine sources for wafer defects and provide solutions to mitigate wafer defects. The operation of a given wafer processing system 102 is controlled by a particular defect source identifier client 104. In certain embodiments of defect source identifier 100, the defect source identifier client 104 receives solutions from the defect source identifier server 107. The solutions are applied to the wafer processing system 102 (either automatically or input from an operator), and the solutions are used to control the operation of the wafer processing system.

Since the operation and function of the client computer 105 and the server computer 107 are so closely related (similar client/server operations can be performed by either the client computer 105 or the server computer 107 in the different embodiments of defect source identifier 100), the reference number of elements in the client computer 105 are appended with an additional reference character "a". In a similar manner, the reference characters of the server computer 107, are appended with an additional reference character "b". In sections of the disclosure in which it is important to differentiate the elements of the client computer 105 from the elements of the server computer 107, the suitable respective reference character "a" or "b" is provided. In sections of the disclosure that either or both of an element of the client computer 105 or a server computer 107 can perform the prescribed task, the appended letter following the reference character may be omitted.

The client computer 105 and server computer 107 comprise a respective central processing unit (CPU) 160a, 160b; a memory 162a, 162b; support circuits 165a, 165b; an input/output interface (I/O) 164a, 164b; and a communications bus 166a, 166b. The client computer 105 and the server computer 107 may each be fashioned as a general-purpose computer, a workstation computer, a personal computer, a laptop computer, a microprocessor, a microcontroller, an analog computer, a digital computer, a microchip, a microcomputer, or any other known suitable type of computer. The CPU 160a, 160b performs the processing and arithmetic operations for the respective client computer 105 and server computer 107.

The memory 162a, 162b includes random access memory (RAM), read only memory (ROM), removable storage, and disk drive storage that, singly or in combination, stores the computer programs, operands, operators, dimensional values, wafer process recipes and configurations, and other parameters that control the defect source identification process and the wafer processing system operation. Each bus 166a, 166b in the client computer 105 or the server computer 107, provides for digital information transmissions between respective CPU 160a, 160b; respective support circuits 165a, 165b; respective memory 162a, 162b; and respective I/O 164a, 164b. The bus 166a, 166b in the client computer 105 or the server computer 107 also connects respective I/O 164a, 164b to other portions of the wafer processing system 102.

I/O 164a, 164b provides an interface to control the transmissions of digital information between each of the elements in the client computer 105 and/or the server computer 107, and different portions of the wafer processing system 102. Support circuits 165a, 165b comprise well-known circuits that are used in a computer such as clocks, cache, power supplies, other user interface circuits, such as a display and keyboard, system devices, and other accessories associated with the client computer 105 and/or the server computer 107.

The defect source identifier 100 utilizes an automated defect source identification software program, portions 182 and 184 of which are stored in the memory 162a or 162b to execute respectively on the client computer 105 and the server computer 107. The DSI software 182, 184 interacts with the DKL software 188 to facilitate access and manipulation of the DKL information via the DSI client 104. The defect source identifier 100 automatically derives the source of a defect and either displays the possible causes with minimal user intervention and/or automatically remedies the defect by adjusting the process parameters of the wafer processing system 102 that led to the defect. Due to automation of comparison with past historical defect records, the defect source identifier 100 reduces problem solving cycle time, simplifies the defect source identification process, and improves defect identification accuracy.

The defect source identifier 100 may be organized as a network-based application that generates an executive summary screen that is typically subdivided into a plurality of graphical user interface screens. In one embodiment, the graphical user interface screen displays its interfaces and defect sources at the defect source identifier client 104. The users at the defect source identifier client 104 can thus interface with the defect source identifier client to populate the respective screens that are generated by data stored at the defect source identifier server 106. The selected configuration of the defect source identifier depends largely on the operational and performance characteristics desired.

Defect Source Identifier Operation and Structure

Figure 2:
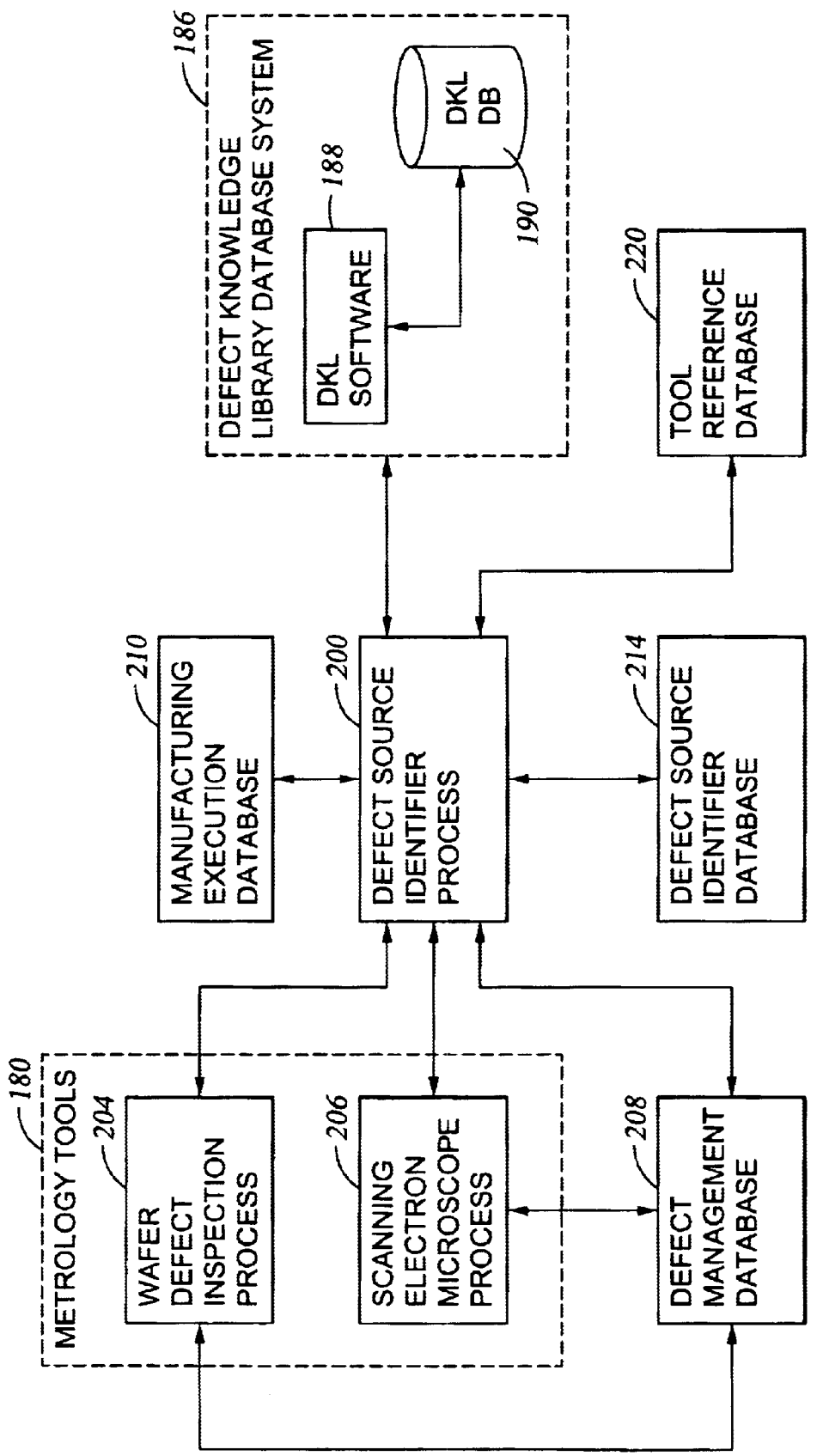
FIG. 2 shows a block diagram illustrating the processes and databases comprising the defect source identifier of FIG. 1.

Different embodiments of the defect source identifier 100 receive data, text, images, defect case histories, etc. from one or more of a wide variety of databases and metrology tools 180. FIG. 2 shows one embodiment of the interrelated processes and databases utilized by the defect source identifier 100.

The varied processes included in the embodiment of the defect source identifier 100 shown in FIG. 2 comprise a defect source identifier process 210, the wafer defect inspection process 204, the scanning electron microscope process 206, a defect management database 208, a manufacturing execution database 210, a defect source identifier database 214, the defect knowledge library database system 186 (including defect knowledge library software 188 and a defect knowledge library database 190), and a tool reference database 220. To best understand the invention, the reader should simultaneously refer to FIG. 1 and FIG. 2. Certain ones of the metrology tools 180, databases 208, 210, 214, 216, 218, 220, or process 200 may be fashioned using software, hardware, databases metrology equipment, and/or any suitable component as described.

The wafer defect inspection process 204 and the scanning electron microscope process 206 are applied to the metrology cell 124, and may be referred to as the metrology tools 180. The metrology tools 180 may further include such processes as a wafer defect inspection process, a scanning electron microscope, a transmission electron microscope, optical imaging equipment, spatial signature analyzers, focused ion beam analyzers, and the like. Generally speaking the metrology tools may include any form instrument, equipment, or process that facilitates the identification of defects on a wafer or defects in an integrated circuit formed on the wafer (generally referred to herein as defects or wafer defects interchangeably).

KLA-TENCOR® of San Jose, Calif. is a producer of such metrology tools as electron microscope process 206. The defect images from the wafer defect inspection process 204 and/or the scanning electron microscope process 206 are produced as defect information in the form of, e.g., a "KLA file" or KLA resource files (KLARF). The KLA file is a flat ASCII file produced by computer equipment. The same KLA or KLARF file format can be used to save defect information from either the wafer defect inspection process 204 and/or the scanning electron microscope process 206.

The defect source identifier 100 supports the KLA or KLARF files produced by the wafer defect inspection process 204. The KLA, KLARF or image files from the metrology tools 180 are exported from the metrology tools onto a directory local to the metrology tools. Each metrology tool 180 is connected to the defect source identifier process 200 to make available the metrology tools export directory as a Network File System (NFS) mountable file system such that the files are remotely accessible as discussed below.

The scanning electron microscope process 206 is used to inspect the surface or subsurface of the wafer. One embodiment of the scanning electron microscope process automatically classifies general defect types as the defects are identified by the microscope. One embodiment of the scanning electron microscope process 206 generates defect inspection information as a KLA file, or other similar image-storing file, that can be utilized in, stored by, or displayed within the defect source identifier server 106 or the defect source identifier client 104. The scanning electron microscope process produces an image that can be stored and/or analyzed.

An embodiment of the defect source identifier client 104 includes a display to view defect images referenced by the KLA files produced by such metrology tools 180 directed at wafers located in the metrology cell 124 as the wafer defect inspection process 204 or the scanning electron process 206. One embodiment of the defect source identifier 100 allows wafer defect case histories to be displayed. An image from a current defect may be displayed beside the image of a case study defect (reference image) for comparison purposes. The defect source identifier system 100 creates and displays a wafer map image for each wafer that will visually indicate the location of defects on the wafer and also support the defect knowledge library database system 186.

The defect management database 208 contains defect images, data, and information regarding a wafer or lot of wafers presently being processed. Such images, data, and other recently collected information may be utilized during repetitive wafer defect analysis of one or more wafers. Such repetitive wafer defect analysis may be utilized to provide defect repeater information (e.g., a similar defect occurrence at the same location of subsequent processed wafers) and adder information (where a similar defect has not occurred in a similar location in another wafer). The data, images, or other information may also provide cluster information, where multiple instances of a defect occur within a given region.

The defect source identifier process 200 is coupled to the manufacturing execution database 210. One embodiment of a manufacturing execution database 210 includes a WORKSTREAM® manufacturing execution system, manufactured by CONSILIUM® of Mountain View, Calif. The manufacturing execution database 210 may be operationally or structurally divided into a distinct FAB manufacturing execution database portion and a routing manufacturing execution database portion. The routing manufacturing execution database portion controls the flow routes of the wafer lots through the wafer processing system 102 during the manufacturing process. As such, the manufacturing execution database contains routing information about which processes have been applied to each wafer or wafer lot. Such lot routing information is useful in determining those processes (or series of processes) that wafers having defects have undergone.

The manufacturing execution database 210 may also include an equipment interface and a recipe management system. The manufacturing execution database 210 therefore contains considerable information about the conditions used by each of the process cells 103 to process each wafer. The manufacturing execution database 210 thus forms "context information" and forms a message to send to a recipe management system that is used to set the recipe for processing each wafer. The context information can be used to uniquely identify the process that is going to occur in a recipe in a specific process cell, and includes such information as lot number, entity, product, route, etc.

The recipe management system produces a "recipe" based on the message provided by the manufacturing execution database. The recipe is essentially the process instructions, such as the pressure, temperature, gas flow, etc. for that product in that step. The manufacturing process steps are then performed by the respective processing tool in accordance with the setup and the recipe. Some data collection is performed by the wafer processing system 102 such as reports on when the processing began, ended, etc. This information is sent to the manufacturing execution database 210 and stored, e.g., in a lot and entity record in the memory.

The tool reference database 220 provides a description of the processing parameters for each processing tool utilized in the defect source identifier 100. The tool reference database 220 includes such information as which wafers have been processed in which process cells, the types of processes performed on each wafer, the operating parameters under which each wafer was processed, etc. The tool reference database 220 can be used by the defect source identifier 100 to indicate the conditions in process cells that led to certain defects.

Certain embodiments of the defect source identifier process 200 provide configuration capabilities that allow users to select displayed data for each defect source identifier client 104. An embodiment of the defect source identifier 100 updates defect data provided by each metrology tool 180, such as, the wafer defect inspection process 204 and the scanning electron microscope process 206.

The defect source identifier database 214 temporarily stores information relating to a defect. The defect source identifier database 214 contains specific data from the KLA files produced by the wafer defect inspection process 204 and the scanning electron microscope process 206. Database 214 generally stores recently collected data within the client 104. The defect source identifier database 214 also contains file references to the inspection image files. The data in database 214 may be processed locally within the client 104, then transmitted to the server 106, or the raw data may be transmitted directly to the server 106 for processing.

The defect knowledge library database system 186 stores, and organizes and permits access to, images, data, or other information relating to the historical defect cases collected by the defect source identifier 100. The images, data, or other information in the defect knowledge library database 190 is preferably compiled by interaction, over time, with a plurality of individual defect source identifier clients 104. In one embodiment, the images, data, and other information associated with the defect knowledge library database system 186 is stored in the memory 162b of the server computer 107. However, this information could be distributed amongst each of the client 104 and the server 106. As such, although the DKL software 188 and DKL database 190 are depicted in FIG. 1 as residing in the server 106, these portions of the DKL system 186 could be distributed amongst the clients 104 and server or servers 106.

In one embodiment, each defect source identifier client 104 may be operated by a different company, different groups within a company, or different facilities within a company. Alternatively, multiple defect source identifier clients 104 may be operated by the same company or group. The larger the volume of wafer case histories contained in any particular defect knowledge library database system 186, the greater the potential number of historic wafer defects (and their respective individual solutions) that can be suitably stored and/or analyzed. For example, the historical defects relating to multiple defect source identifier clients 104 that are in communication with the defect source identifier server 106 may be stored as data in the memory 162b of the defect source identifier server 106. Only certain, authorized defect source identifier clients 104 may access the data, images, or other information contained in the defect knowledge library database system 186. Such knowledge sharing amongst disparate groups or even companies promotes increased manufacturing efficiency by identifying solutions to defects quickly for all participants.

The images, data, or other information relating to defects initially detected by a first defect source identifier client 104 (operated by a first company or group) may be later utilized for analysis purposes by a second defect source identifier client 104 operated by a different company or group. The identity of the company or group operating any defect source identifier client 104 typically cannot be determined to the operators of any other defect source identifier clients (unless permission is granted).

Certain aspects of the process cell conditions, recipes, operating temperatures, and/or one or more solutions to the defect may be provided to the operators of all defect source identifier client. However, some sensitive information, e.g., specific process recipes, may have restricted access. Nonetheless, the number of historical wafer data, images, and amount of information relating to most processes can be increased, and thus wafer defect analysis can be made more reliable, by utilizing the vast defect knowledge library database system 186 that includes information from multiple defect source identifier clients 104.

An embodiment of the defect source identifier process 200 gathers such defect attributes as adders, repeaters, spatial signature analysis, and cluster information from the defect management database 208. The defect source identifier process 200 gathers lot routing information from the manufacturing execution database 210. The defect source identifier process 200 of selected system users may access the defect knowledge library database system 186. The defect knowledge library database system 186 may be accessed through known database access programs and techniques such as using Active X Data Objects (ADO).

The images produced by the wafer defect inspection process 204 and the scanning electron microscope process 206 are typically in the form of TIFF files. Images, data, and other information in database processes 208, 210, 214, 186, and 220 can also be stored in TIFF file format. In one embodiment multiple images may be contained in a single TIFF file in which the image file directory in the TIFF file contains multiple entries, one entry for each image. To contain multiple images in the same file, the file includes not only the multiple images, but also alignment data indicating the alignment of the different images in the file. Both alignment and defect image data are thus contained in TIFF file that is referenced in the KLA File. Storing multiple images in a single TIFF file avoids a separate TIFF file for each image. The multiple images associated with a single defect may be contained in a single, or multiple, TIFF file. Multiple TIFF files are defined by multiple TiffFileName records in each of the KLA Files.

The defect source identifier system 100 is configured to convert TIFF defect image files to JPEG-compressed or MPEG-compressed image files because the compressed image files are readily transported between any one of the client computers 105 and the server computer 107. The defect source identifier process 200 connects to the scanning electron microscope process 206 and the wafer defect inspection process 204. This connection between processes 204 and 206 allows the user to access the process's 204, 206 historic KLA files and/or other image files. An embodiment of the defect source identifier process 200 supports retrieving a processing tool list from a flat file within the tool reference database 220.

The defect source identification server 106 runs a defect source identifier database using CPU 160b to access memory 162b. One embodiment of the defect source identifier may use a database that is accessed by the defect source identifier servers 106, e.g. an SQL server database.

The defect source identification client 104 may contain well-known network client software that is designed to support interaction with the network server. The network client software includes an operating system such as WINDOWS NT® (a registered trademark of Microsoft Corporation of Redwood, Wash.), SOLARIS® (a registered trademark of Sun Microsystems, Inc. of Palo Alto, Calif.), or IRIX® (a registered trademark of SGI of Mountain View, Calif.). The defect source identification client 104 runs a browser such as INTERNET EXPLORER® (a registered trademark of the Microsoft Corporation of Redmond, Wash.) or NETSCAPE NAVIGATOR® (a registered trademark of Netscape Communications Corporation of Mountain View, Calif.). The defect source identifier could be developed in such languages as BASIC, C, C++, or other object-oriented or traditional computer programming languages.

In one embodiment, the defect source identifier server 106 accesses the defect knowledge library database system 186 through the communication ports of the defect knowledge library database system 186. The defect knowledge library database system 186 is compatible with BASIC, C++, or C. The defect source identifier server 106 accesses the manufacturing execution database through communication process s that are compatible with BASIC, C++, or C. Certain embodiments of database software support enterprise networks (including ORACLE8i® from Oracle Corporation, QUEST™ Quest Software of Irvine, Calif.), through COM processes that are compatible with BASIC, C++, or C.

Figure 3:
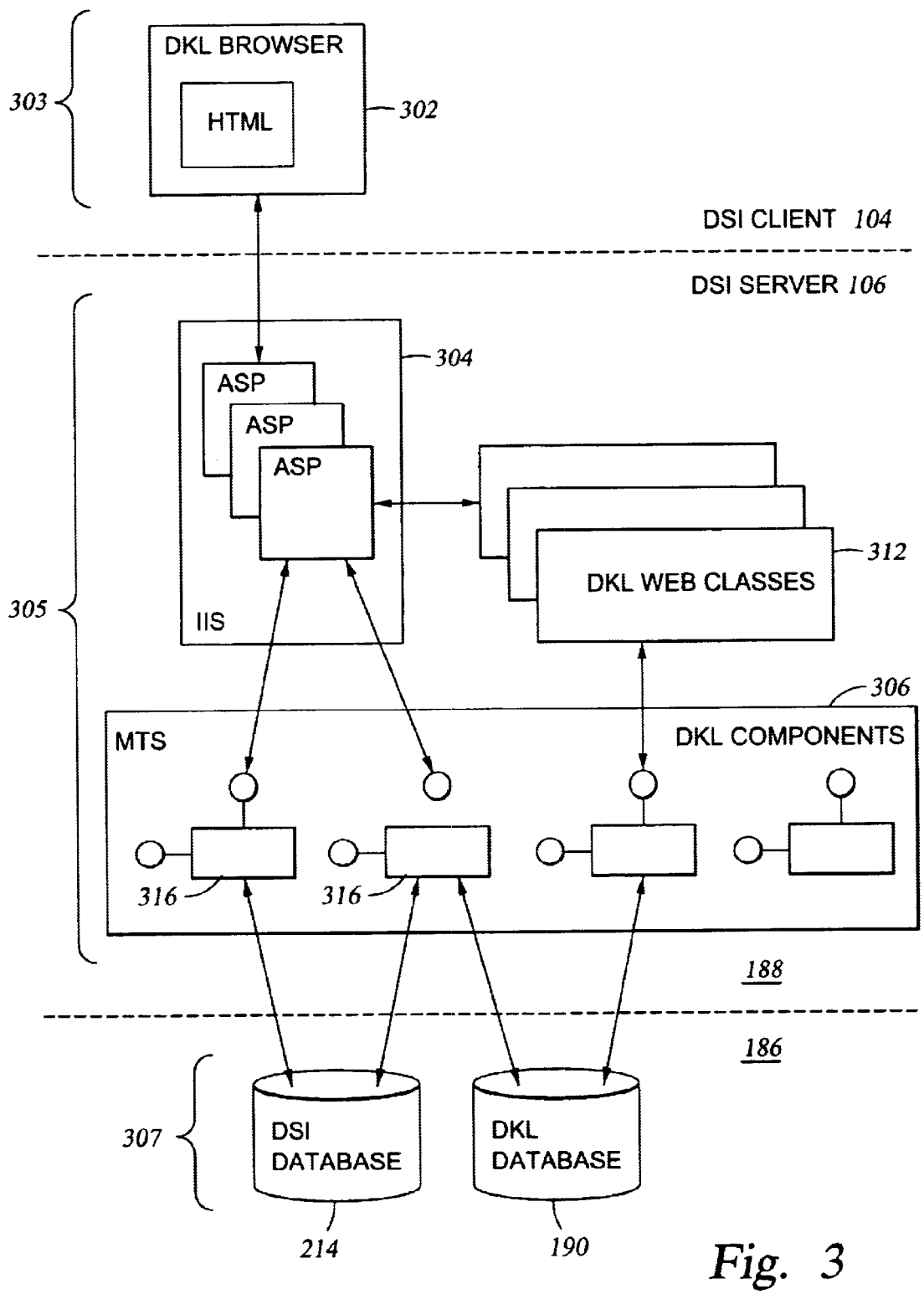
FIG. 3 shows an architectural diagram of the defect knowledge library database system of FIG. 2.

One embodiment of defect knowledge library database system 186 is shown in FIG. 3. The defect knowledge library database system 186 has a three tiered client-server architecture including a client tier 303, a middle tier 305, and a data tier 307. The client tier 303 provides user interfaces for the defect knowledge library database system 186. The client tier 303 consists of a browser 302 that is utilized to provide a network connection between the client computers 105 and the server computer 107. The browser software (that may include a HTML browser or XML browser) used in one embodiment of client tier preferably utilizes such web browsers as INTERNET EXPLORER® or NETSCAPE NAVIGATOR®. The client tier resides on any wafer defect inspection process and scanning electron microscope process needing access to defect source identifier.

One embodiment of the middle tier 305 comprises, e.g., server software such as MICROSOFT® Internet Information Server 304 and a MICROSOFT® Transaction Server 306, and the defect knowledge library components 316. The middle tier processes resides on the defect source identifier server 106 of FIG. 1. The middle tier implements the business rules for the client application, manages transactions with the embodiments of database processes 210, 212, 214, 190, 218, and 220 shown in FIG. 2, and serves web pages to the browser clients.

One embodiment of the data tier consists of a SQL database server that includes the defect source identifier database 214 and the defect knowledge library database 190. User accounts with security levels need to be created in the defect source identifier database 214. The defect source identifier 100 may have a user cross-reference file created and located on the defect source identifier server 106 that cross-references between the wafer defect inspection process 204 and the scanning electron microscope process 206 custom classes to the defect knowledge library database classes.

Authorized users of the defect source identifier 100 can view wafer identification data, defect data; case studies and processing tools together on one screen; view images created from the wafer defect inspection process 204 and the scanning electron microscope process 206 relating to a prescribed defect; view case studies that apply to a specific set of defects classes caused by one or more of the processing tools 103 (shown in FIG. 1) the lot of wafers were processed through; view images from case histories; display the images of the current defect with images from case histories; and/or search for previous wafers to view their defects and relevant case studies.

The defect source identifier 100 can invoke multiple computer functions including: internal initialization; shutdown; error handling; upload KLA result files when available into the defect source identifier database 214; and uploading the customer class translation file to the defect source identifier database 214. The translation file maps tool configured custom classes to defect knowledge library database classes and uploads routing files from one or both of the manufacturing execution database 210 to the defect source identifier process 200 to be stored in the defect source identifier database 214. The routing file stored in the defect source identifier database 214 can be accessed by other process of the defect source identifier 100 to provide more rapid access to the images or information.

The defect source identifier server 106 has a product installed that allows it to connect to Network File System (NFS) mountable file systems on the wafer defect inspection process 204 and scanning electron microscope process 206. One such product is DISK ACCESS from Intergraph Corporation. Each scanning electron microscope process 206 and wafer defect inspection process 204 requiring access to defect source identifier 100 must have their KLA and image file export directories available to the defect source identifier server 106 as NFS mountable file systems. As such, the files do not have to physically reside within the server 106 to be used by the client 104 or server 106 in performing defect analysis.

The interfaces to the manufacturing execution database 210, the defect knowledge library database system 186, and the wafer defect inspection process 204, and the scanning electron microscope process 206 are now described.

The defect source identifier 100 collects data from the manufacturing execution database 210 (such as CONSI- LIUM WORKSTREAM® manufacturing execution system) to provide access to a list of processing tools that have been used to process the wafer lot. TABLE 1 contains information that is used to identify and extract data from the manufacturing execution database 210. TABLE 2 displays output information from the manufacturing execution database 210. Each wafer that is processed in the wafer processing system 102 is uniquely identified by the combination of wafer identification, lot identification and date.

TABLE 1

Identifying Information for each Metrology Tool
Used by Manufacturing Execution Database Process

| Name | Comment |
|---|---|
| ToolType | Wafer defect inspection process or scanning electron microscope process |
| Tool ID | Unique metrology tool identification |
| Date | Current |
| Lot ID | |

TABLE 2

Output Information from Manufacturing Execution Database Process

| Name | Comment |
|---|---|
| Lot ID | |
| Date | |
| List of tools | Ordered list of processing tools that processed the wafer before the testing tool. If multiple processing tools are used, the processing tools are listed from first to last. If the mode is off-line, all the processing tools are returned in order of processing. |

Where there is no access to a manufacturing execution database 210, the wafers are routed through a fixed path. The routing path used for all wafers is stored in a spreadsheet or database file, e.g., an EXCEL® or ACCESS® file. The listing of processing tools in the routing path in the file are arranged in the order of processing within the defect source identifier. Table 3 describes the format of the processing tool file:

TABLE 3

Processing Tool File Format

| Name | Comment |
|---|---|
| ToolType | Process tool type |
| ToolID | Process tool identifier |

Figure 4:
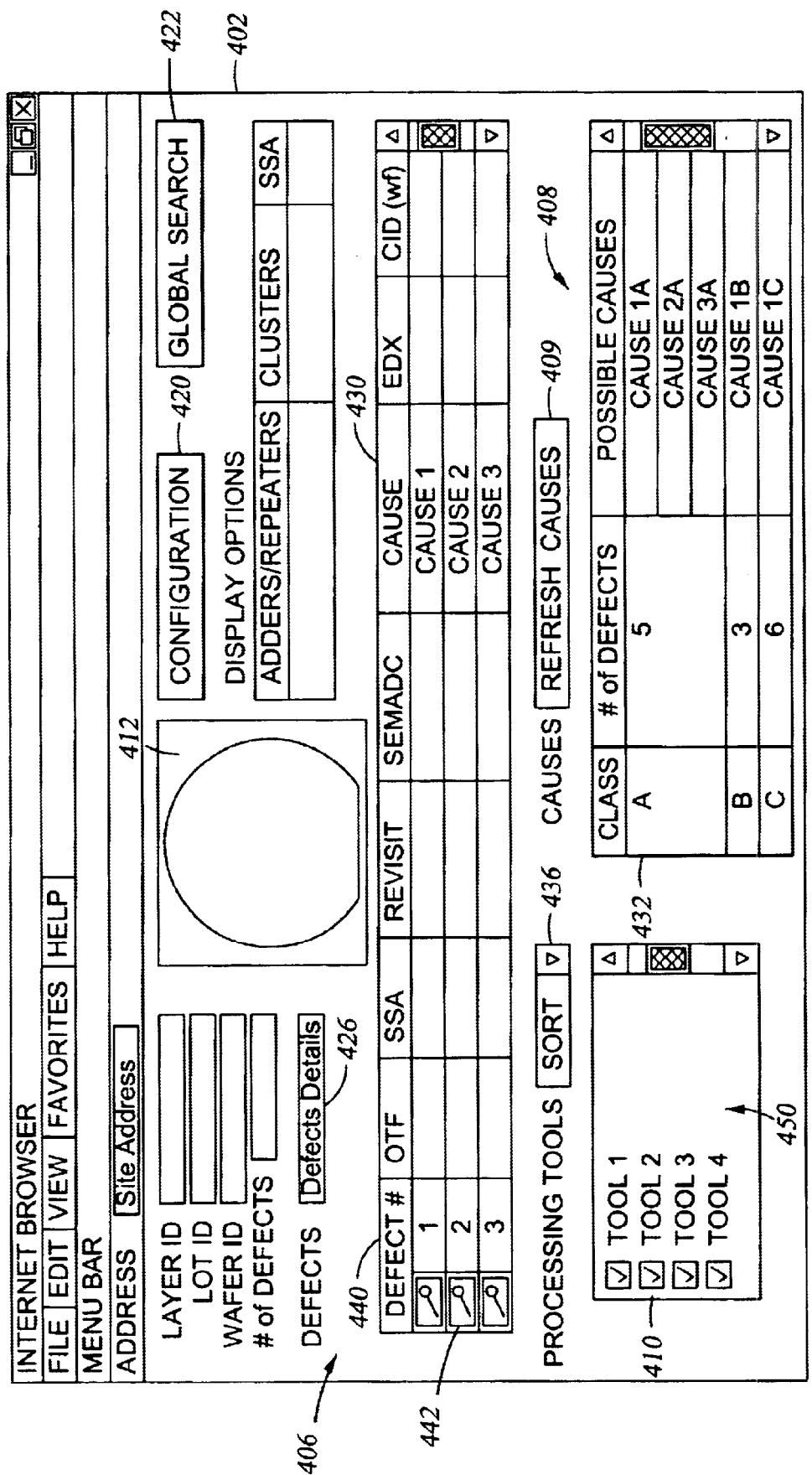
FIG. 4 shows a defect summary screen that may be displayed by the defect source identifier of FIG. 1.

FIG. 4 shows a defect summary screen 402 as displayed within a Internet Browser that is used to illustrate data, images, and other information related to defects in a tabular format. The defect source identifier 100 uses the defect knowledge library database system 186 to determine the list of causes associated with each defect displayed in the defects table section of the defect summary screen 402. The defect source identifier database system 186 is also used to determine the list of causes for each class of defect in the defects table 406. The defect source identifier can then display the list of causes in the causes table 408 of the defect summary screen 402. The defect knowledge library database system 186 retrieves case study details that the defect source identifier 100 displays to the user upon a user requests made via the screen 402. TABLE 4 displays information retrieved from the defect knowledge library database system 186, and is used to extract data from that system.

TABLE 4

Defect Knowledge Library Database System Data

| Name | Comment |
|---|---|
| Case State | |
| Case Type | |
| Platform | Optional. |
| Defect Classification | |
| Tool Ids | Optional |
| Energy Dispersive Microanalysis System Elements | Optional |

The information included in the fields of TABLE 5 describes the exemplary data types that can be retrieved from the defect knowledge library database system 186.

TABLE 5

Defect Knowledge Library Database System Data Types

| Name | Format | Comment |
|---|---|---|
| Case Number | Long | Unique case identifier |
| Case Description | String | |
| Case Author | String | |
| Case Date Created | Date/Time | |
| Platform | String | Tool type |
| Chambers | String | |
| Process Types | String | |
| Processes | String | |
| Equipment State | String | |
| Type of Cleaning | String | |
| Gases | String | |
| Details Description | String | Case details |
| Details Author | String | |
| Details Date | Date/Time | |
| Symptom Description | String | |
| Symptom Author | String | |
| Symptom Date | Date/Time | |
| Problem Description | String | |
| Problem Author | String | |
| Problem Date | Date/Time | |
| Root Cause Description | String | |
| Root Cause Author | String | |
| Root Cause Date | Date/Time | |
| Solution Description | String | |
| Solution Author | String | |
| Solution Date | Date/Time | |
| Defect Name | String | |
| Shape | String | |
| Defect Mechanism | String | |
| Root Cause Category | String | |
| Area Next to Defect | String | |
| Surface Depth Location | String | |
| Primary Elements | | |
| Trace Elements | | |
| Size | String | |
| Scanning Electron Microscope Image | | |
| Energy Dispersive Microanalysis System | | |

The classes (including the KLA files generated by the scanning electron microscope process 206 and the wafer defect inspection process 204) can be customized on a tool by tool basis based upon appropriate input by each user. A spreadsheet of a database file such as an EXCEL® or ACCESS® (registered trademarks of Microsoft Corporation of Redmond, Wash.) file can be used to contain the custom classifications defined on the scanning electron microscope process 206 and wafer defect inspection process 204, and then cross-referenced with classifications used in the defect knowledge library database system 186. This cross-reference file is loaded into defect source identifier database 214. Table 6 describes the format of the cross-reference file:

TABLE 6

Format of a Cross-Reference File

| Name | Comment |
|---|---|
| ToolType | Metrology tool type |
| ToolID | Metrology tool identifier |
| ToolClass | Metrology Tool classification |
| Defect Knowledge Library Database System Class | Defect knowledge library database system classification |

The defect source identifier 100 displays the data collected from the wafer defect inspection process 204 and the scanning electron microscope process 206 in the defects table 406 of the defect summary screen. All defects are assigned an on-the-fly class from wafer defect inspection process. Selected defects may be analyzed further using an optical microscope and be provided a revisit class. A subset of these defects can be analyzed even further using the scanning electron microscope process 206 and be given a scanning electron microscope-automated defect classification class. Thus, a single defect may be assigned various defect classifications depending upon the metrology tools used to inspect the defect.

At the end of inspection, a single KLA result file is generated by each metrology tool used to inspect the defect along with image files for each defect. For the scanning electron microscope process 206, the KLA result file is produced per wafer. For the wafer defect inspection process 204, the KLA result file is produced per lot. If the revisit process is performed on a wafer, only one wafer defect inspection process KLA file is produced showing the combined information for the on-the-fly and revisit classifications.

The wafer defect inspection process 204 and the scanning electron microscope process 206 export their KLA result files and image files to a directory that is located locally to the process 204 and/or 206 i.e., either in the tool's computer or in the client computer. These export directories are available to the defect source identifier 100 as Network File System mountable file systems as described above.

The KLA file typically is configured to contain many records. One embodiment of the records used by the KLA file of the defect source identifier can be arranged as follows:

InspectionStationID <tool manufacturer><tool model><tool ID>;
ResultTimestamp <date><time>;
Lot identification <lot id>, (char16)
Wafer identification <wafer id>; (char16)
SampleTestPlan <number of dies tested> (header record)
Wafer layout data
TiffFileName <filename>
DieOrigin<x><y> (coordinates of lower left corner of Die (0,0)
ClassLookup <number of classes>
ClassList
DefectRecordSpec (header record)
Defect data
EndOfFile Various embodiments of records associated with the KLA files are now described. The SampleTestPlan record is a header to indicate the start of the wafer layout coordinates for each die in the tested wafer as shown in TABLE 7.

TABLE 7

Wafer Layout Coordinates of Sample Plan

| Name | Format |
|---|---|
| X Position | Integer |
| Y Position | Integer |

A Class Lookup header is provided to indicate the start of the class mapping data. The records following the ClassLookup header are indicated in TABLE 8 and contain the classification number and the classification name corresponding to the number.

TABLE 8

Records Following ClassLookup Header

| Name | Format |
|---|---|
| ClassNumber | Integer |
| ClassName | Char |

The DefectRecordSpec header indicates the start of the defect data. The records following the DefectRecordSpec indicated in TABLE 9 contain all the defect data for the wafer.

TABLE 9

Records in DefectRecordSpec header

| Name | File Format | Comment |
|---|---|---|
| Number of Fields | Int 32 | Number of fields in defect list records - varies from different inspectors |
| DEFECTID | Int32 | |
| XREL | Float | |
| YREL | Float | |
| XINDEX | Int32 | |
| YINDEX | Int32 | |
| XSIZE | Float | |
| YSIZE | Float | |
| DEFECTAREA | Float | |
| CLASSNUMBER | Int32 | Used to access case studies in the defect knowledge library database system |
| IMAGECOUNT | Int32 | Number of images for this defect not limited |
| IMAGELIST | Int32 | Variable length list of image data associated with the defect |
| CLUSTERNUMBER | | |
| REVIEWSAMPLE | | Indicates membership in a defined plan for review |
| DEFECTBINNUMBER | | Indicates membership in a defect bin based on simple defect characteristics |
| FINEBIN | | Indicates membership in a defect bin based on automatic defect review |

Figure 5:
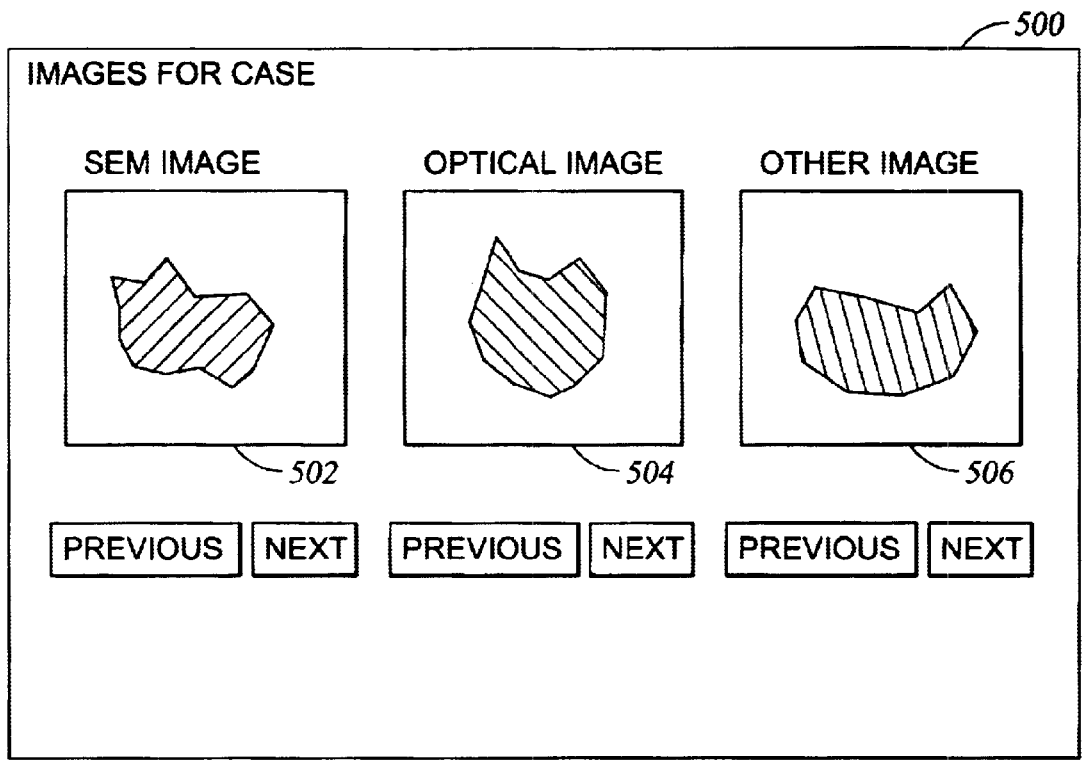
FIG. 5 shows a case image screen that may be displayed by a defect source identifier of FIG. 1.

A user can select the case images column 442, to open a new browser displaying a case image screen 500 corresponding to images associated with a selected case study. The embodiment of case image screen 500 shown in FIG. 5 is organized so the defect source identifier 100 can retrieve images presently generated or previously stored by the scanning electron microscope process 206, the wafer defect inspection process 204 (e.g., an optical imager) and other such metrology tools 180. The images 502, 504, and 506 depict various views of a particular defect by three different metrology tools.

Figure 6:
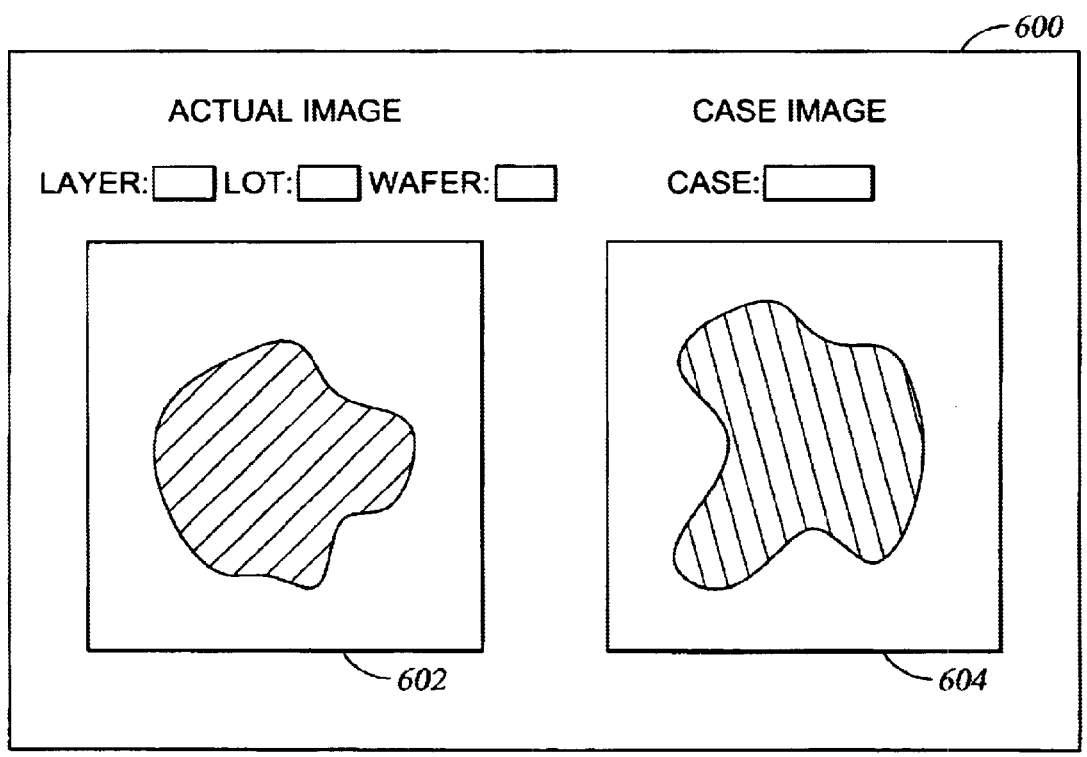
FIG. 6 shows an image compare screen that may be displayed by a defect source identifier of FIG. 1.

The user can select to compare one of the images 502, 504 or 506 displayed in the case image screen 500 of FIG. 5 with an image from a wafer defect case history retrieved from the defect knowledge library database 190. To facilitate such a comparison, the user selects an image compare screen 600 as shown in FIG. 6. The user then selects the particular case history image 604 associated with a suspect cause of the defect to display in the image compare screen 600 along with the selected image 602 from screen 500. The use of the DKL system 186 in identifying defects, their cause and solutions is described in detail in U.S. patent application Ser. No. 09/905,607, filed simultaneously herewith on Jul. 13, 2001.

Graphical User Interface Overview

FIGS. 7 to 14 illustrate a set of graphic user interfaces (GUIs) to provide for interaction with the defect knowledge library database system 186. FIG. 15 is a flow diagram of one embodiment of a method 1500 of interactivity with the DKL system 186. The GUI interaction with the defect knowledge library database system 186 includes a series of interface screens such as: a browse defect screen 700, 900 (embodiments shown in FIGS. 7 and 9); a search screen 800 (an embodiment shown in FIG. 8); an edit screen 1000 (an embodiment shown in FIG. 10); a create screen 1100 (an embodiment shown in FIG. 11); an image gallery screen 1200 (an embodiment shown in FIG. 12); and a configuration screen 1300 (embodiments shown in FIGS. 13 and 14). The GUI screens shown in FIGS. 7 to 14 provide the interactive method for a user to input analysis and other related information relating to a wafer defect to a defect knowledge library database system 186 and have the information stored in the DKL database 190.

The GUI screens may be considered to each represent different "states" to allow input of different information, and different display information, to be input into the DKL database 190. Though the term "screen" is used in many cases in this disclosure to describe the various GUIs, the terms "screens", "GUIs", or "displays" are used interchangeably.

The embodiments of the distinct GUI screens shown in FIGS. 7 to 14 can be displayed, and interacted with, by selecting certain folder tabs 702, 704, 706, 708, 710, and 712. The folder tabs include a browse folder tab 702, a search folder tab 704, an edit folder tab 706, a create folder tab 708, an image gallery folder tab 710, and a configuration folder tab 712. The defect knowledge library database system 186 allows for case edit/creation, search, analysis, security, viewing images, administration, data interfaces, edit log report, import/export case, and other functions of the screens by selected various tabs or buttons.

Figure 7:
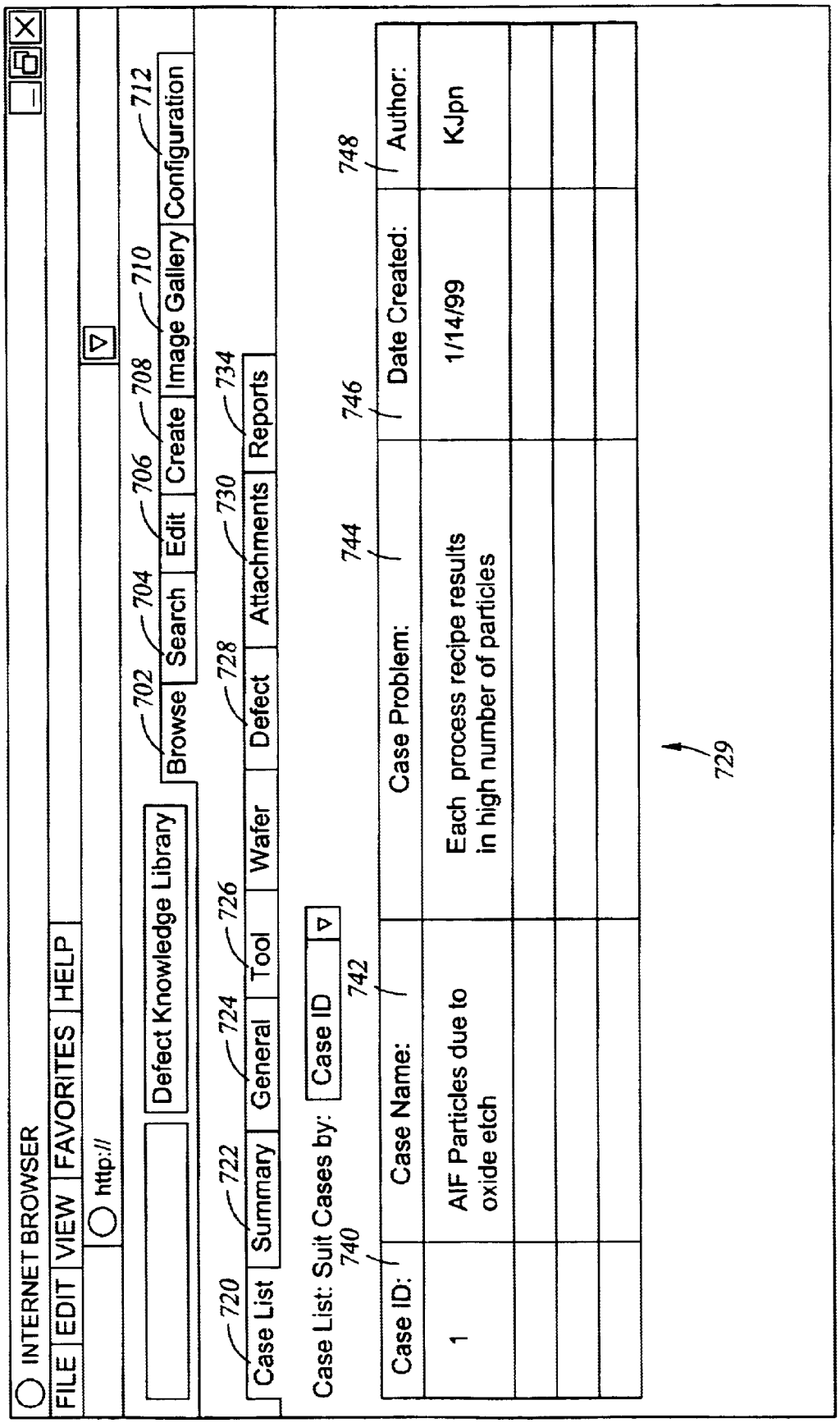
FIG. 7 shows a browse defect screen that may be displayed by of the defect knowledge library database system of FIG. 3.

If the browse folder tab 702 is selected by the user in any of the GUI screens shown in FIGS. 7 to 14 of the defect knowledge library database system 186, the browse defect screen 700 or 900 shown in FIGS. 7 and 9, will be displayed. The browse defect screens 700 and 900 allow the user to view existing historical defect cases. The defect knowledge library database system 186 of the defect source identifier 100 displays the browse defect screen 700 upon log-on.

The browse defect screen 700, 900 has a plurality of sub-tabs. One embodiment of the sub-tabs include a case list sub-tab 720, a summary sub-tab 722, a general sub-tab 724, a tool sub-tab 726, a wafer sub-tab 728, a defect sub-tab 730, an attachments sub-tab 732, and a reports sub-tab 734. The list of the various folder tabs and sub-tabs included in the defect knowledge library database system is exemplary. The case list sub-tab 720 is selected to provide a list of cases arranged in a table 729 that can be supported by selecting the case list sub-tab 720. The columns provided on a case list table 729 include, e.g., case ID 740, case name column 742, case problem column 744, date created column 746 and author column 748. The information contained in each column is self explanatory from the column title.

Selecting the summary sub-tab 722, the summary screen 900, as displayed in FIG. 9, is displayed. The summary screen 900 provides a general overview of the defects, and the common state of each wafer in the historical record. The summary screen 900 is divided into a plurality of fields, including a background field 940, case detail field 942, and a defect detail field 944. The background fields may include such fields as platform, chamber, process name, process step, types of cleaning, and gases within the chamber. The case detail field 942 may include such fields as problem, root cause, corrective action, and recommendation fields, and the case author. The defect detail field 944 may include spatial signature analysis and wafer maps and paretos field. Paretos is used to open the menu by spatial signature analysis (if SSA is available), by on-the-fly classes if KLA result file (KLARF) is available, or by metrology tool 180 classification (e.g., wafer defect inspection process 204 or by scanning electron microscope process 206). Other fields in the defect detail fields may include, e.g., optical classification and image thumbnails, scanning electron microscope process classification and image thumbnails, focused ion beam classification and image thumbnails, transmission electron microscope classification, and image thumbnails, etc.

Selecting the general sub-tabs 724 in the browse defect screen 700 will display a general screen, not shown. The general screen includes variety of fields including case name, case date, case security, problem, root cause, corrective action, recommendation, author, analysis, date created, company, site, etc.

Selecting the tool sub-tab 726 on the browse defect screen 700 displays tool screen, not shown. The tool screen displays the fields associated with the chamber together with process and wafer information. The fields in the tool screen include platform, mainframe, tool ID, technology, chamber type, process type, process description, process step, gases, and cleaning information.

Selecting the wafer sub-tab 728 in the browse defect screen 700 displays a wafer screen, not shown. All the fields associated with the wafer information are provided on the wafer screen. The fields typically provided on the wafer screen include wafer type, wafer tracking number (wafer ID), lot ID, wafer size, film type, film thickness, location of a majority of defects, processing chamber, and wafer maps.

Selecting the defect sub-tab 730 on the browse defect screen 700 displays a defect field including all fields associated with the defect classification elements (analysis with the wafer defect inspection process, analysis with the scanning electron microscope process, wafer map, and energy dispersive microanalysis system). The fields on the browse defect screen 700 include spatial signature analysis class, defect location, on-the-fly classification distribution, optical classification images, scanning electron microscope-manual classification, focussed ion beam, transmission electron microscope, etc.

Figure 10:
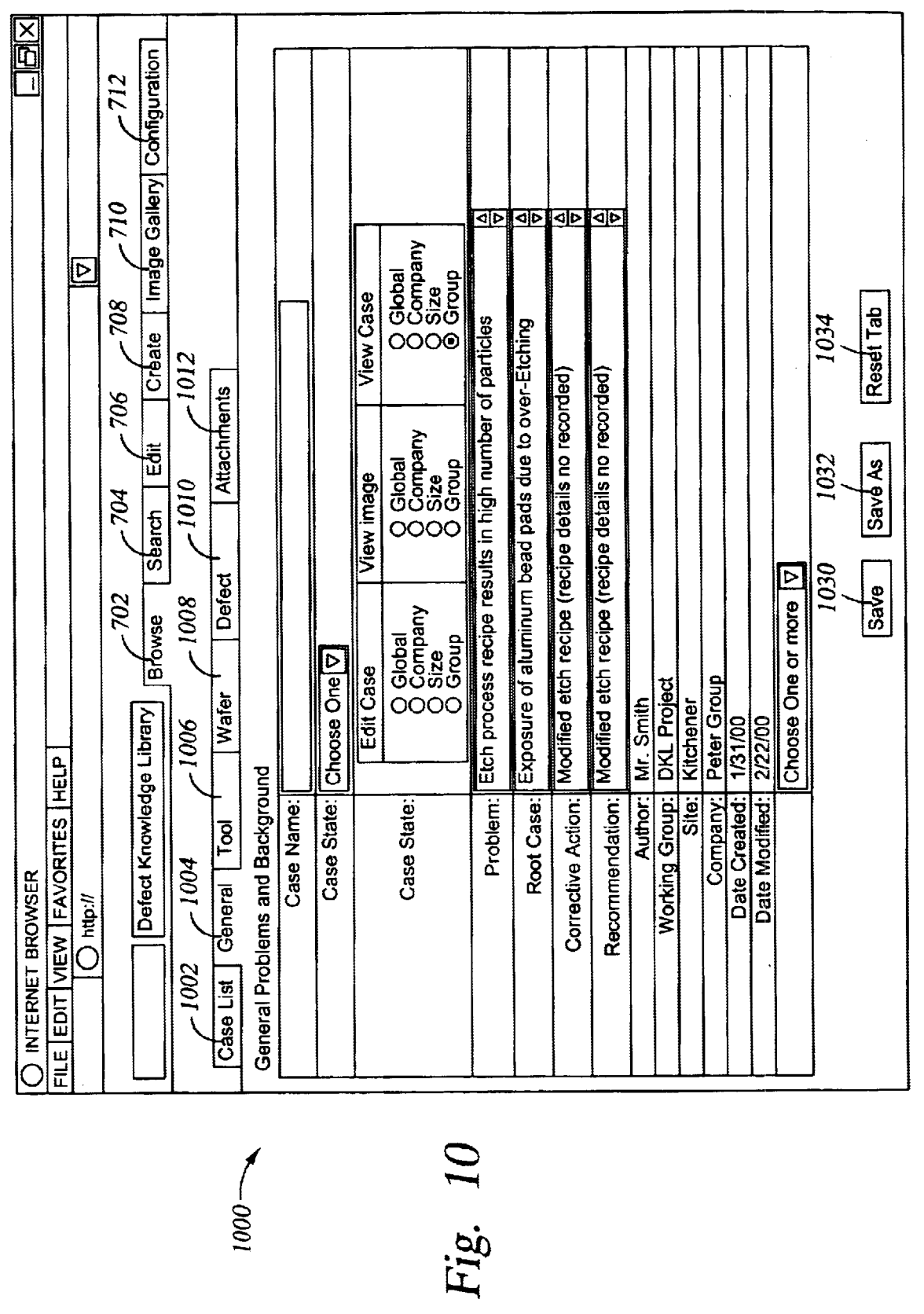

The edit screen 1000 shown in FIG. 10 displays the current historical case with all parameters in editable fields. Each field is edited by either entering new data or using option buttons and drop-down lists for fields with limited values. The edit screen 1000 organizes the case data in several sub-screens that may be accessed by sub-tabs. These sub-tabs include a case list sub-tab 1002, a general sub-tab 1004, a tool sub-tab 1006, a wafer sub-tab 1008, a defect sub-tab 1010, and an attachments sub-tab 1012. When editing a case, users will be required to save changes before switching tabs. The tabs may be accessed in any order. The edit screen 1000 is pre-filled with the values set for the selected case, ready to be edited. Thus, the case information displayed on the browse defect screen is similar information to that displayed on the edit screen 1000 in editable format.

The case list sub-tab 1002 produces a case list sub-field, one embodiment of the case list sub-field includes the input fields shown in TABLE 10.

TABLE 10

Inputs on the Case Tab:

| Name | Description | Field Type |
| --- | --- | --- |
| Case ID | The case identifier that uniquely defines a case. | Free text (numbers only) |
| Case Name | A descriptive name of the case. | Free text (accepts wildcards) |
| Case State | Search cases by the state of the case (New, Approved etc.) | Dropdown |
| Date and Time of Case Creation | Search based on the Date and time a case was created. Start and end ranges are specified. | Free text (allows ranges) |
| Author | Search based on the Author/creator of the case. The current user will be the first in the list. | Dropdown |
| Manager | Search based on the Manager of the author of a case. The security group identifies managers | Dropdown |
| Company | Search for cases that were created at a specified company | Dropdown |
| Keyword | Search for cases that have specific keyword associations. Up to 10 keywords may be selected from a list | Dialog, Dropdown, etc. |

The tool sub-tab 1006 produces a tool sub-field, one embodiment of the tool sub-field includes the input fields shown in TABLE 11.

TABLE 11

Inputs are on the Tool Tab:

| Name | Description |
| --- | --- |
| Platform | Platform of the process tool (CENTURA ®, ENDURA ® etc.) |
| Tool Type | Tool type of the process tool (etch, CVD etc.) |
| Tool ID | The tool serial number |
| Chamber Type | Chamber type of the process tool (MxP+, DPS, etc.) |
| Process Type | Process type used by the chamber |
| Process Technology | Choose the process technology from a pre-defined list. New items may be added. |
| Process Step | Free text to indicate the process step |
| Process Description | Free text to indicate special characteristics of the process |
| Reactive Gases | May select several gases from a pre-defined list. New gases may be added. |
| Inert Gases | May select several gases from a pre-defined list. New gases may be added. |
| Cleaning Gases | May select several gases from a pre-defined list. New gases may be added |
| Cleaning Information | Free text to indicate the cleaning method used. |

The defect sub-tab 1010 produces a defect sub-field, one embodiment of the defect sub-field includes the input fields shown in TABLE 12.

TABLE 12

Inputs on the Defect Tab

| Name | Description |
| --- | --- |
| Description | A description of the defect |
| Size | The size of the defect |
| Location | The location of the defect by pre-defined areas on a wafer |
| Step | Layer used in processing. Selection effects the available choices in the classification lists |
| Spatial Signature Analysis Classification | The spatial signature analysis classification of the defect |
| On-the-Fly Classification | The on-the-fly classification of the defect |
| Scanning Electron Microscope-Automated Defect Classification | The scanning electron microscope automatic classification of the defect |
| Scanning Electron Microscope-Manual Classification | The scanning electron microscope manual classification of the defect |
| Optical Wafer Defect Inspection Process Classification | The optical wafer defect inspection system classification of the defect |
| Focused Ion Beam Classification | The focused ion beam classification of the defect |
| Transmission Electron Microscope Classification | The transmission electron microscope classification of the defect |
| Energy Dispersive Microanalysis System | The energy dispersive microanalysis elements found in the defect. Specified by type (primary, interior, etc.) |
| Images | Images of the defect. Images are added by one of the following types: spatial signature analysis, on-the-fly, scanning electron microscope process, Optical wafer defect inspection process, focused ion beam, transmission electron microscope, or energy dispersive microanalysis system. |
| Analysis Tool Type | The type of review or inspection tool that analyzed the defect |
| Analysis Tool ID | The tool identifier of the review or inspection tool that analyzed the defect |

The general sub-tab 1004 produces a general sub-field, one embodiment of the general sub-field includes the input fields shown in TABLE 13.

TABLE 13

Inputs on the General Tab

| Name | Description |
| --- | --- |
| Case Name | A descriptive name of the case. |
| Case State | State of the case (analyzed, approved etc.) |
| Case Security | These settings effect which users have access to view and edit the case |
| Analyst | The analyst of the case |
| Problem | The problem description |
| Root Cause | The root cause of the problem |
| Corrective Action | The corrective action to fix the problem |
| Recommendation | Case recommendations |
| Keyword | Keywords associated with the case. Any number may be added and new keywords may be defined |

The defect sub-tab 1008 produces a defect sub-field, one embodiment of the defect sub-field includes the input fields shown in TABLE 14.

TABLE 14

Inputs are on the Wafer Tab:

| Name | Description |
| --- | --- |
| Lot ID | The lot name or serial number |
| Wafer ID | The wafer name, serial number, or slot number |
| Wafer Type | The type of wafer |
| Defect Location | Location of the majority of defects on the wafer |
| Product | The product produced from the wafer |
| Step | The wafer step or layer |
| Wafer Size | The size of the wafer |
| Film Type | The type of film |
| Film Thickness | The film thickness |
| Wafer Maps | Wafer map images are attached |
| Paretos | Pareto images are attached |

The attachment sub-tab 1012 produces an attachment sub-field, one embodiment of the attachment sub-field includes the input fields shown in TABLE 15.

TABLE 15

Input Sub-Fields on the Attachment Tab:

| Name | Description |
| --- | --- |
| Type | The file type of the attachment. Either image, KLARF, URL, or other file. |
| Title | The title or description of the attachment. |
| Location | The location of the file to be attached. |

Valid options for the case state include an analysis option, an analyzed option, a duplicate option, an approved option, a paused option, and a rejected option. Users are required to select a process tool type and platform to add a process tool to a case. The interface supports adding multiple process tools to a case. The dropdown list may be used to cycle through all the process tools in the case. The delete button 1106 removes a process tool from the case. Removing a process tool will also remove any chambers associated with the process tool from the case. The 'add new' button adds the process tool. To add a chamber to the case, the user must first select a process tool. The 'add new' button is used to add chambers to the process tool.

To add a chamber to a process tool the user must select and provide the following fields: chamber position field, chamber type field, and process type field. Selection of the chamber type effects the available options in the process type field. Multiple chamber can be added to a process tool and thus to a case. The dropdown list may be used to cycle through the chambers of a process tool. Users may add multiple wafers to a case. A dropdown list may be used to cycle through all the wafers in a case. To add a wafer to a case users will be required to enter the wafer type.

The delete button will remove the current wafer from the case. Any wafer maps and parts associated with the wafer will also be deleted from the case when the delete wafer button is selected. Deleting a wafer will not delete any defects that may be associated with the wafer. However, the association between the defect and the wafer will be lost. Users may add multiple defects to a case. A dropdown list of defects is used to cycle through all the defects in a case. The delete button will remove the selected defect from the case when a delete defeat button is selected. Any defect or names associated with the defect will be deleted by selecting the delete defect button. Selecting the step option will effect the available classification choices. Only one classification may be specified for each classification type. Changing the step of the defect will clear any of the classification type selections made. The classification of attached defect image is implied by the classification of the defect itself. If the classifications are not selected then attached images will assume the 'Unknown' classification. For scanning electron microscope process images the classification will use both scanning electron microscope-automated defect classification and scanning electron microscope-manual modes. Multiple images for each classification type may be added using the add button. The remove button will remove an image from the defect. The preview button can be used to view the selected image.

Multiple metrology tools 180 may be applied to inspect for wafer defects. The user is required to select the metrology tool type before adding the metrology tool. Entering the metrology tool identifier is optional. The attachment type, title and location fields are all required to be entered before a file attachment may be added. A listing of all current attachments is displayed on the screen. Current attachments may not be edited, however they can be removed using the remove button. New attachments will not be transferred to the defect source identifier servers 106 until the save button has been selected or the user switches tabs.

Some fields contain an "add new", selection as the first item in the dropdown menu. These fields are platform, process tool type, chamber type, process type, process technology, keyword, wafer type, gas. Selecting the "add new" item opens popup window. The user may add a new selection to the list using the popup window. The new item will appear in all subsequent case edits and on the search screen 800 selections.

The following buttons appear on the bottom of the edit screen 1000, one embodiment shown in FIG. 10. A save button 1030, a save as button 1032, and a reset tab button 1034. The save as button 1032 opens a popup dialog prompting the user to insert the new case name. The case identification, user name and date values will be entered automatically. The save button 1030 saves any changes to the current case but keep the user in edit mode with the same case being the current case. The reset tab button 1034 restores the tab to the state prior to any edits.

Figure 11:
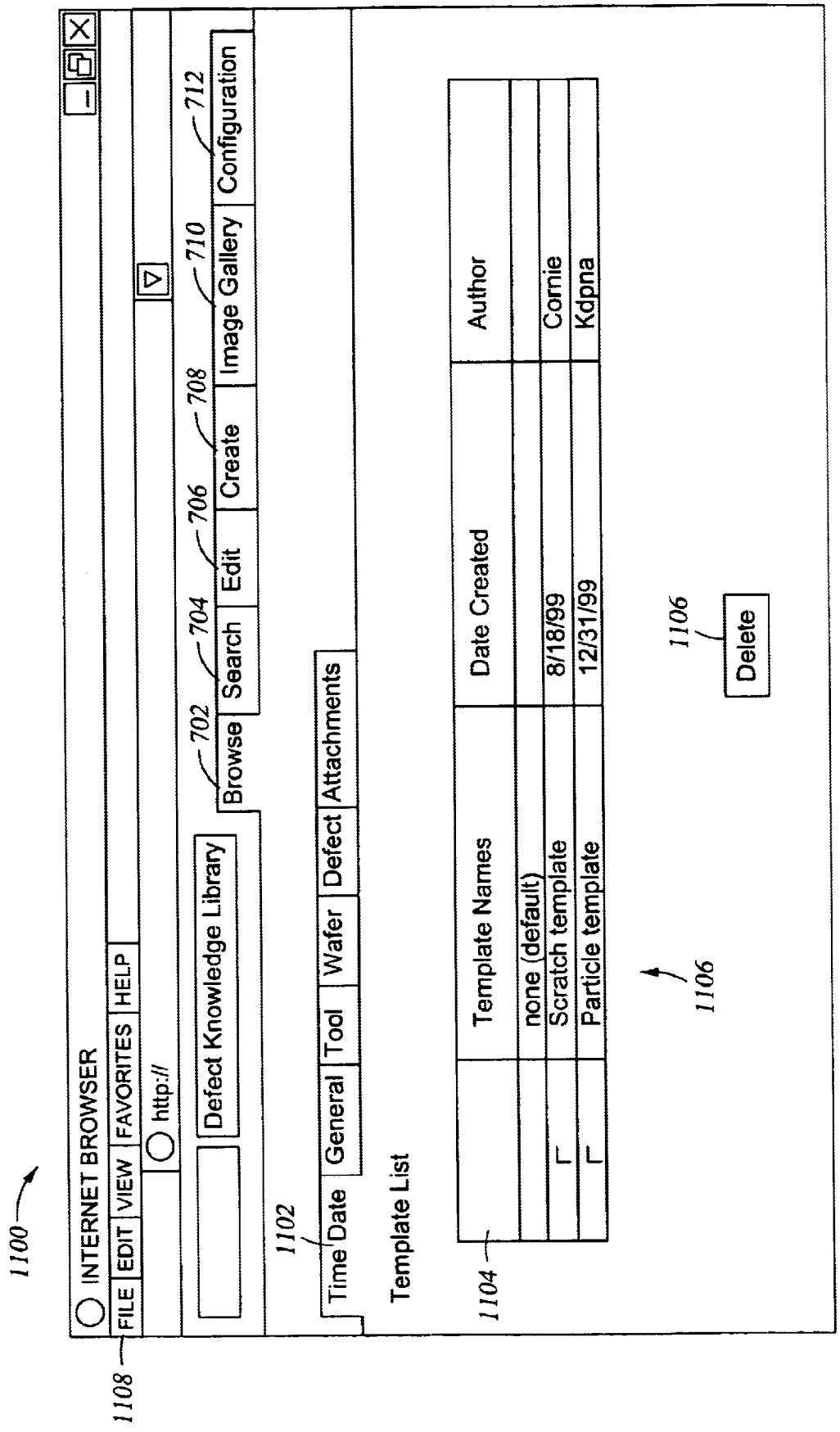
FIG. 11 shows a create screen that may be displayed by the defect knowledge library database system of FIG. 3.

Selecting the create tab 708 opens a create screen 1100, one embodiment shown in FIG. 11 that allows the user to create a new case from scratch, create a new case from a case template, create a new template from scratch, or create a new template from an existing case template. The create screen 1100 is similar in operation to the edit screen 1000, except for the sub-tabs association with the templates sub-tab. In the templates sub-tab the user is provided a list of all existing templates or "none" (default) if the user would like to create a case from scratch. The create tab also displays the characteristics of any of the case templates.

The user can create a new case by either using a case template to start or by starting from scratch. To create a case from an existing template, the user selects the template name 1104 from a template list 1106 appearing under the template tab 1102, which sets all fields to the values stored in that template. The data set in the template can thus range from a completely blank case, to a completely filled one. The user can then change any of the pre-filled fields to meet their needs, then select a save case button to save the data to the defect knowledge library database 190.

To create a case from scratch, the user can select a blank from the template tab. The blank template is loaded by default when the create tab 708 is selected. The user can change any field to meet their needs. When the desired input data is input, the format of the create screen 1100 appears similar to the format of the edit screen 1000. The user can select the save as button 1032 to save the new data to the database. A case author can attach existing files to a defect knowledge library case as part of the case. File sources are always from the local system directories, and may be KLARF's, other defect map data, text files, or any other format. The defect knowledge library database system processes KLARF and TIFF format files, and supports viewing of JPEG format images. All other file formats are available for viewing the file type. If only a hard copy of an image is available for a case, the user scans the image to create an electronic version. The scanning can be accomplished with third party systems and takes place outside of the defect knowledge library database system. The resultant image file may be attached to the case, and then further viewed (in supported formats). One embodiment of defect knowledge library database system 186 supports the attached file types and processing as shown in TABLE 16.

TABLE 16

DKL supported File Types and Processing

| Source File Type | Further Processing Required by DKL | Result in DKL |
| --- | --- | --- |
| KLARF | YES | Viewing of wafer map |
| KLARF | YES | Viewing of Pareto charts |
| TIFF | YES | Attached file saved in JPEG format |
| JPEG | NO | Viewing of image (browser) |
| OTHER | NO | Attached file saved in source format |

Case templates reduce the repetitious entry of known data pertaining to tool configurations, parameters, etc. Authorized users may create case templates at any time. The saved template has the same authority privileges/security as a case does (read/write/copy security). The create template function can be accessed from two different screens. To create a template from scratch, the user selects "none" from the template list 1106. To create a template from an existing template, the user selects the template name from the template list 1106 which sets all fields to the values stored in that template. The data set in the template can range from a completely blank case to a completely filled one. Once the user makes the desired changes to the fields, they can select the save as template button. The user then enters the template name, selects the OK button, and the template is added to the list of case templates.

The template section is accessible from anywhere in the application. There is no prerequisite needed to create a new case other than having the proper security privileges. The defect knowledge library database system 186 does not include any pre-loaded case templates, except for the default blank template. All fields are validated once the user tries to save a new template on a new case not as each is entered. It should be noted that when creating a new case, certain fields are required and the case may not be saved unless all of the required data is filled. If the user fails to fill in any of the required fields, a message will be displayed informing them to submit a value for the required fields. At the bottom of the template list screen is a delete button 1106. The user must first select a template then select the delete button to remove the template.

The sub-tabs in the create screen 1100 include: save, save as, reset, tab, and save as template (these sub-tabs are not shown in FIG. 11, but are accessed under the file menu 1108). The 'save as' button will open a popup dialog prompting the user to insert the new case name, the case identification, the user name, and the date will be entered automatically. The save sub-tab will save any changes to the current case but keep the user in edit mode with the same case being the current case. The reset sub-tab will restore the case to its state prior to any edits. The save as template button will save the current case as a template for future use. The Save as template brings the user to the template list screen. The user then enters a template name in a popup window.

Figure 12:
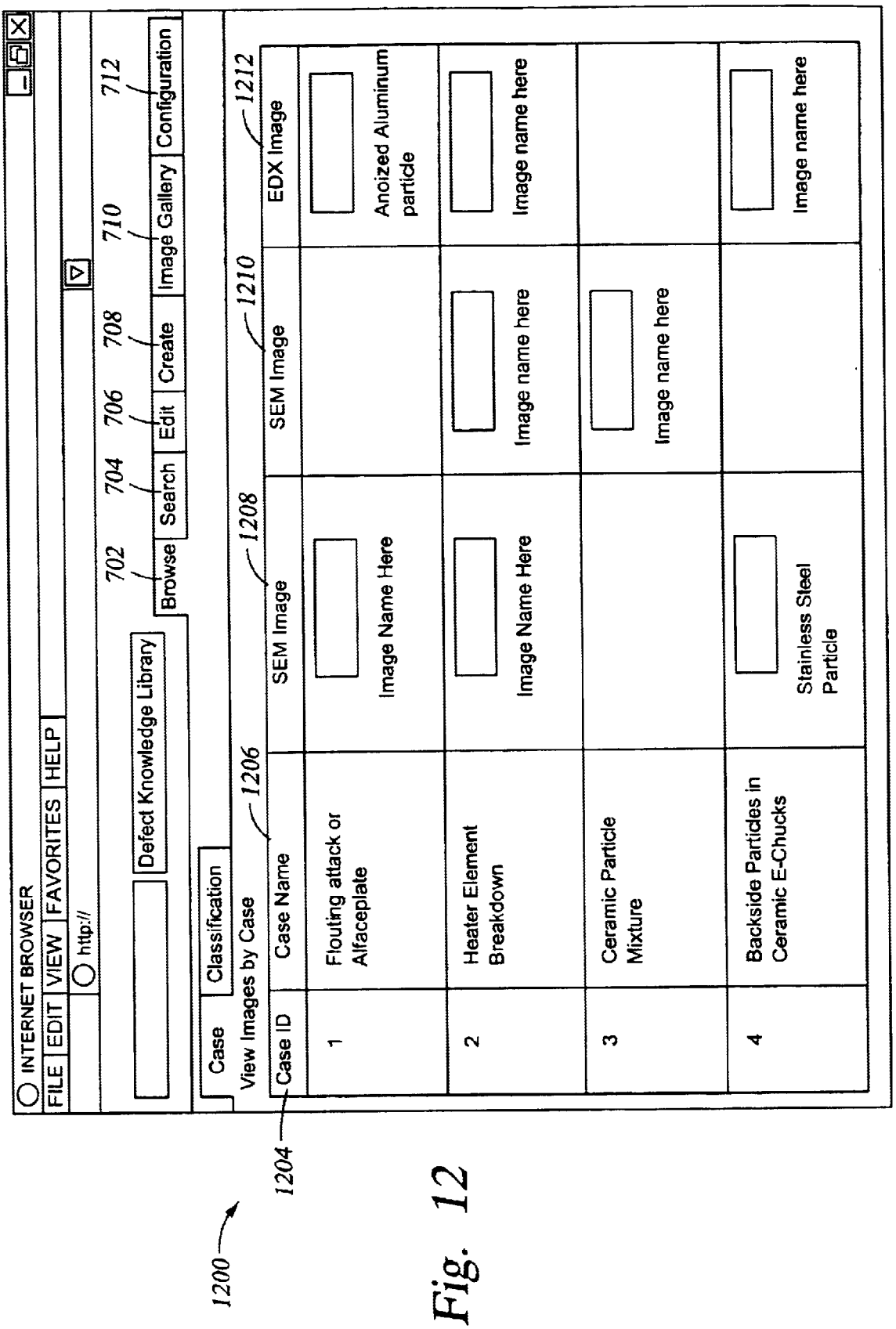
FIG. 12 shows an image gallery screen that may be displayed by the defect knowledge library database system on FIG. 3.

Selecting the image gallery button 710 in any of the screens shown in FIGS. 7 to 14 will provide a display of an image gallery screen 1200, one illustrative embodiment is shown in FIG. 12. The image gallery screen 1200 allows a user to view images from a variety of metrology tools 180 such as the scanning electron microscope process 206, the wafer defect inspection process 204, an energy dispersive x-ray microanalysis (EDX) system and so on. The exemplary columns displayed in the image gallery screen 1200 include a case ID column 1204, a case name column 1206, a scanning electron microscope process image column 1208, an optical image column 1210, and an EDX image column 1212. Typically, one image per case is provided for each column 1208, 1210, and 1212 (if an image is provided for each image type).

The defect knowledge library database system 186 includes support for transferring cases between two different defect knowledge library database systems. To transfer of a case the user must export a case to disk (or other memory device) then import the case to any additional defect knowledge library database systems. The case transfer function can be used to transfer case information to the various clients for local use. The transfer function operates databases that use the same data model. The exporting capabilities provides one-way, semi-automatic transfer of cases. The case is exported in a format that is not readable in text editors and is provided solely to transfer cases between defect knowledge library database systems. In a preferred embodiment, keywords associated with the case are exported with the case. One embodiment of the fields associated with exporting cases is shown in TABLE 17.

TABLE 17

Fields Associated with Exporting Cases

| Parameter Name | Description |
| --- | --- |
| Case ID | The ID of the case that is going to be exported |
| Destination | Path on disk to export the case file |
| Hide Source | The user may specify to hide the identity of the case author, group, and company |
| Class Mapping | An option to indicate whether to export class mapping images |

In one embodiment, only cases with global permission level may be exported. If the case does not have the appropriate permission level, then the export will not proceed. In one embodiment, the LOT ID, Wafer ID, and ToolSerialNumber are not exported with a case. If the hide source option is selected then the identity of the case will not be exported with the case information. This includes the author, group, site, and company that created the case. This option will affect whether the case source field will be pre-filled when users import a case.

The class mapping option determines whether the classification images will be exported along with the case. The classification images are used by the importing system to help map between classification formats. The exporting function creates a file in the specified directory that contains the case information. Users with the appropriate permissions may import cases from other defect knowledge library database systems. The import function processes files generated by the case export. To import a case the user must specify the location of the case file. Selecting a valid case file will display some of the key information pertaining to the case such as the case name. The case source (i.e. Author, Company etc.) is also displayed if the exporter did not choose to hide this data. If the case source is not available the user will be able to specify this information. One embodiment of the fields associated with importing cases is shown in TABLE 18.

TABLE 18

Fields Associated with Importing Cases

| Parameter name | Description |
| --- | --- |
| Source | Specifies the location of the case file to import. |
| Case Security | Specifies the case permission level of the case imported. |
| Case Source | Specify the source of the case. This includes the author, group, site, and company |
| Class Mapping | User must indicate the mappings between classifications. |

For the import to proceed the user will be required to indicate the mappings between the classification used in the case file and the classifications of the local defect knowledge library database system. Classification images for classes in the case file will be displayed if the exporter chose to export them. When the destination defect knowledge library database system imports a case, a new case identification will be generated. The destination defect knowledge library database system processes the transferred case through its data import process. The data import interface supplies the user with enough functions to check security, check the syntax of the case to see if it matches the destination database structure and update the destination database with the new case. The data import specifications can be found in the data import section.

Figure 13:
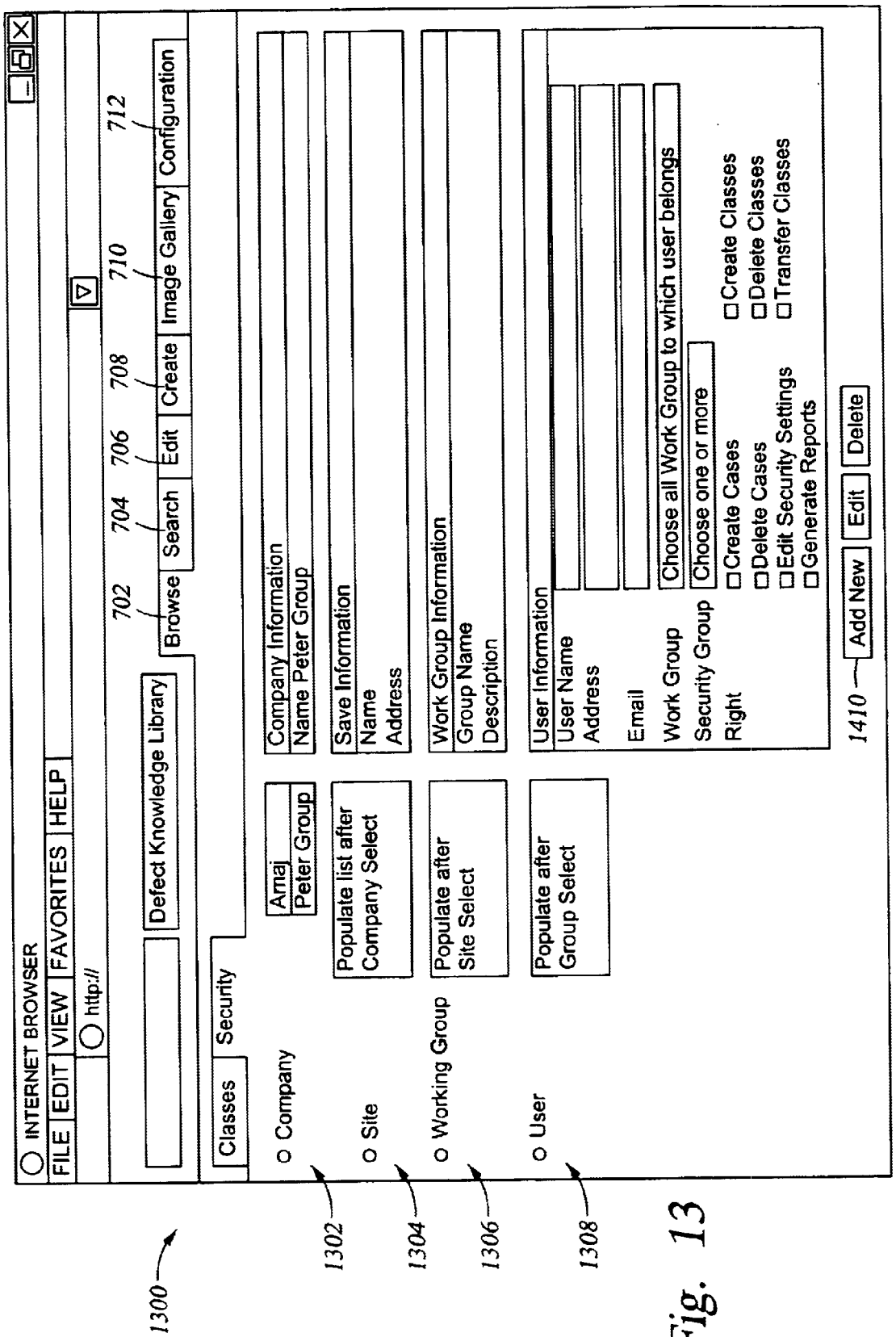
FIG. 13 shows a configuration screen that may be displayed by the defect knowledge library database system of FIG. 3.
Figure 14:
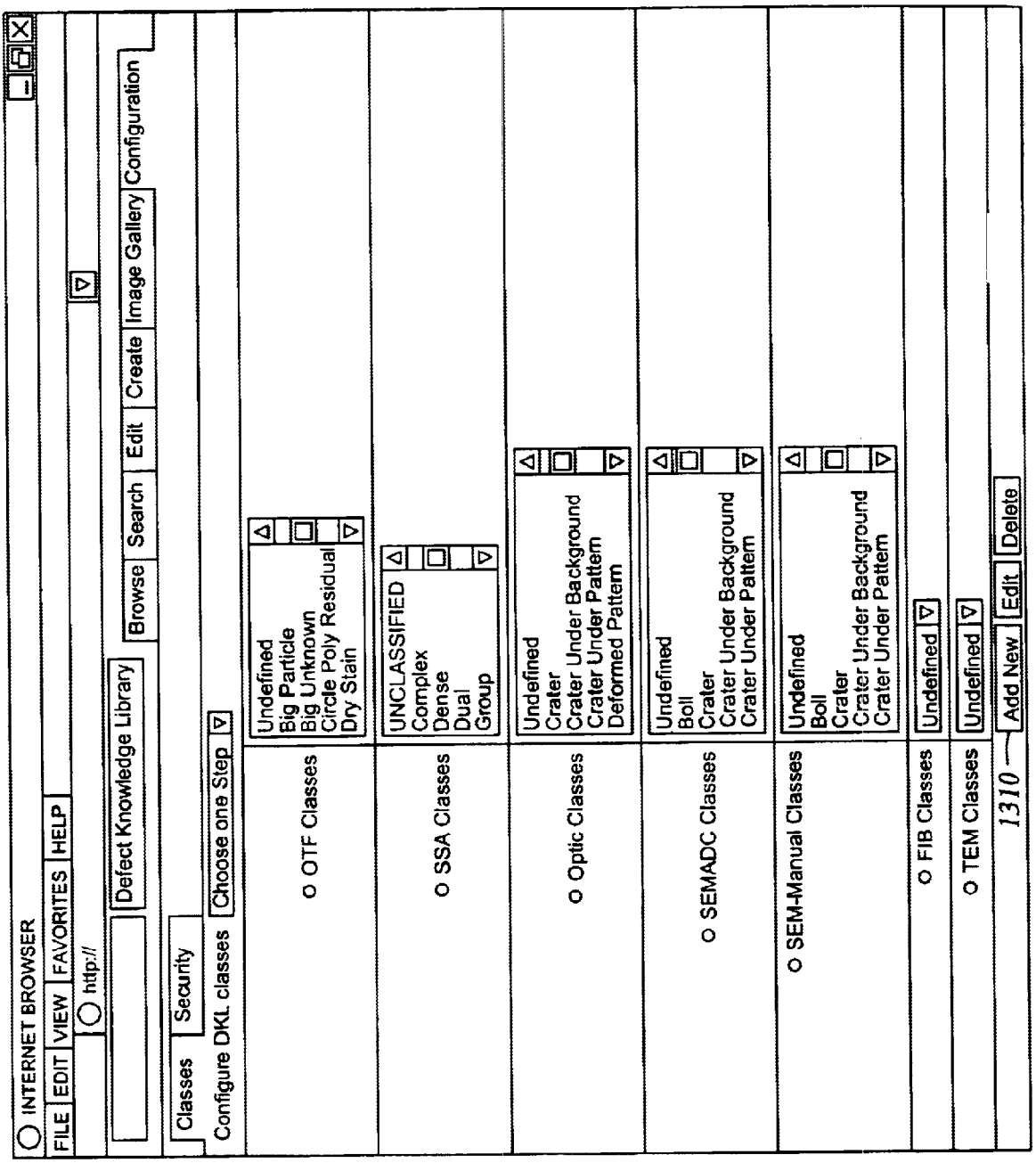
FIG. 14 shows another portion of the configuration screen of FIG. 14.

Selecting the configuration tab 712 from any of the screens shown in FIGS. 7 to 14 of the defect knowledge library database system 186 results in displaying the user configuration screen 1300, different portions of an embodiment which are shown in FIGS. 13 and 14. The user configuration screen 1300 is used to allow new companies, sites, groups and users to be created that can utilize the defect source identifier 100. The fields in the configuration screen 1300 include a company field 1302, a site field 1304, a working group field 1306, and a user field 1308, as shown in the embodiment in FIG. 13.

In one embodiment, each company consists of one or more sites. A site may have one or more user groups. Finally, a user group consists of one or more users. Each user must be a member of both a user group and security group. Security groups determine the access rights of the user. Users may belong to multiple user groups. Each user will have exactly one primary user group and any number of secondary user groups. There no configuration for the security groups. The security groups are pre-configured.

If a user with proper authorization wants to add a new company, they select an add new sub-button 1310 in the company section. One embodiment of the fields associated with the add a company screen is shown in TABLE 19. The add new sub-button acts to clear all fields in the user configuration screen 1300. Users can then add new information into each field. Once satisfied with the new information, the user selects the save button and the system adds the new company to the database. Similarly, a new company site can be created. However, the user must first select a company from the drop down list.

TABLE 19

Exemplary Inputs to Add a Company

| Name | Type | Description |
| --- | --- | --- |
| Company Name | Input Box | The name of the company to add |
| Company Site | Input Box | The site name |
| Company Address | Input Box | The address of the site |

To add a new group in the working group field 1306, the user must first select and provide input to the company and the site field 1304. One embodiment of the fields associated with the add a group screen is shown in TABLE 20. Selecting a company site displaces a listing of that company to the group list box. The user then selects an add new button 1310 selected in combination with the group section acts to add a new working group 1306. The add new button clears all fields. Users can then add new information into each field. Once satisfied with the new information, the user selects the save button and the system adds the new group to the database.

TABLE 20

Exemplary Inputs to Add a Group

| Name | Type | Description |
| --- | --- | --- |
| Company Name | Input Box | The company name from the company list box |
| Company Site | Input Box | The company site |
| Group Name | Input Box | The new group name that will be added |
| Group Description | Input Box | The description of the group to be added |

To add a new user, the company, site and group selections must be made. The user then selects the add new button in the user section to add a new user. One embodiment of the fields associated with the add a user screen is shown in TABLE 21. The add new button clears all fields. Users can then add new information as desired into each field. Once satisfied with the new information, the user selects the save button, and the system adds the new user to the database.

TABLE 21

Exemplary Inputs to Add a User

| Name | Type | Description |
| --- | --- | --- |
| Company Name | Input Box | The company name of the company list box. |
| Site Name | Input Box | The company's site name. |
| Primary Group Name | Input Box | The group name to add the user to from the group list box. Each user has exactly one primary user group. |

TABLE 21-continued

Exemplary Inputs to Add a User

| Name | Type | Description |
| --- | --- | --- |
| Secondary group names | Input Box | The group name for secondary user groups that the user is added to. The user may belong to several secondary user groups. |
| User Name | Input Box | The name of the new user. |
| Email Address | Input Box | The users email address |

To edit a user, group, site or company data in the respective field, the user selects the item to be edited and the information is displayed in the table to the right of the list box. The user then edits the information and select the save button to save the changes to the defect knowledge library database system 186. To delete a user, group, site or company, the user can selects the item to be deleted and select the remove button. A delete confirmation window with popup and, if the user selects okay, the item is deleted from the defect knowledge library database system 186. Only those users who have the authority (based on e.g., passwords, user location, etc. to edit the configuration information may perform these functions.

Each instance of a defect knowledge library database system 186 has a pre-defined set of classifications per layer for certain fields. Tables within the defect knowledge library database system 186 maintain the lists of valid classes. Users can only choose classes from a list of valid choices. The defect knowledge library database system is configured to offer an "unknown" choice for all classifications. Authorized users (those with class editing privileges) use a class form to create and modify valid class choices in the defect knowledge library database system. The authorship and date of creation are included as part of the classification definition. The system permits new classes to be created for the following classifications only. All other classifications contain fixed classes. The system manager determines the lists of fixed classes during system setup and maintenance.

To edit a class, the user must first choose the classification type from the list. The user then chooses the class they would like to edit and selects the edit class button. The system permits authorized users to create new classes for classifications that do not have fixed classes. A form appears, containing the required fields for that class in editable form. The authorized user edits the required fields on the form, keeping in mind that the system also requires attachment of one or more associated defect images. The defect knowledge library database system enables viewing of the images from the Edit Class form. After the form is complete, the user selects the OK button to execute the changes and the system updates the valid class choices for that classification.

If an authorized user wishes to create a new class, they must bring up the create class form by selecting the add new class button on the main classification screen. This form contains the required fields that must be entered before the user can add the new class. The authorized user enters the required fields on the form keeping in mind that the system also requires attachment of one or more associated defect images. Once the form is complete, the user selects the OK button to execute the add, and the system adds the valid class to the appropriate classification category list.

To delete a class, the user must first choose the classification type from the list of three classifications. The user then chooses the class they would like to delete and selects the delete class button. A dialog box appears, asking the user to confirm that they want to delete this class. If the user selects the OK button from the dialog box, the system removes that class from the list of valid classes for that classification.

If a user deletes a class, existing cases in the defect knowledge library database system are not affected. The deletion updates the list of valid choices when editing the case. To update the existing cases in the defect knowledge library database system after deletion of a class, users first search the defect knowledge library database system for cases using the deleted class. The user then edits these cases using the standard procedure for choosing classes.

Some classifications (as specified above) can accommodate new valid class choices. These classifications have a class choice "request new class". Users not authorized to directly create classes can select request new class, if they want to create a class choice. The system displays a request new class form to these users. After the user completes the required fields on the form, the system automatically sends an e-mail message to the user's manager.

The e-mail message is a pre-formatted message, requesting the manager intervention to create a new class. The system sends the e-mail message to an address configured in the user's profile on the defect knowledge library database system. The message contains all of the information from the request new class form. The system sets the class type to "Unknown", by default, after the user completes the request new class form. The user can manually override this choice through normal edit procedures.

The e-mail system displays any error messages concerning e-mail transmission problems to the user. The manager responds to the request by logging into the defect knowledge library database system, opening the case, and directly creating the new class using the procedures outlined above for authorized class creation users. The manager may also decide to assign an existing class using normal edit procedures. The defect knowledge library database system may use an e-mail messaging system such as Microsoft EXCHANGE®.

Each existing, valid class is associated with one or more images. While assigning a class to a defect, users can view the sample images associated with valid class choices. The system displays the first of the associated images and permits them to view additional images, if available. The user views these images to assess the match with their case's defect. The user then selects a class choice from the valid list. Users with class creation privileges can use the edit class form having the input fields shown in TABLE 22 to assign the class associated images to specific classes. The defect knowledge library database system 186 provides a view of a log of edit sessions in the database. The log records case identification, field name, action, user identification, date and time for each case that is altered. The user enters a case identification to run the report. The report is displayed in a new window.

TABLE 22

Input to Edit Class Form

| Name | Description |
| --- | --- |
| Classification Type | Wafer defect inspection process, spatial signature analysis, or scanning electron microscope process, focused ion beam, transmission electron microscope |

TABLE 22-continued

Input to Edit Class Form

| Name | Description |
| --- | --- |
| Class Name | Name of new class. |
| Class Description | Description of the new class. |
| Associated Image | Image that represents the characteristics of the new class. |
| Image Caption | The caption for the image. |
| Image Description | The description of the image as it pertains to the new class. |

A defect knowledge library data import facility is used to transfer cases from any source to any defect knowledge library database system. The defect knowledge library data import facility acts as a communication process, thereby providing the users of the process with an application to use the process. The external application performs the data import by passing data to the defect knowledge library database system 186 through COM methods in conformance with the published COM application. The external application includes certain information such as case name, or in the situation of a new case, provide a new case name. If the external application does not specify case information parameters, the defect knowledge library database system generates them automatically.

The data import process has a class mapping function that is used to match classifications in the imported data against those in the destination defect knowledge library database system 186. Whenever the data import process receives classification data, it calls a class mapping function. This function matches the import classification data against valid choices for the class field on the local system. Classifications that do not match will require the user to assign or create a new classification on the local system.

Figure 15A:
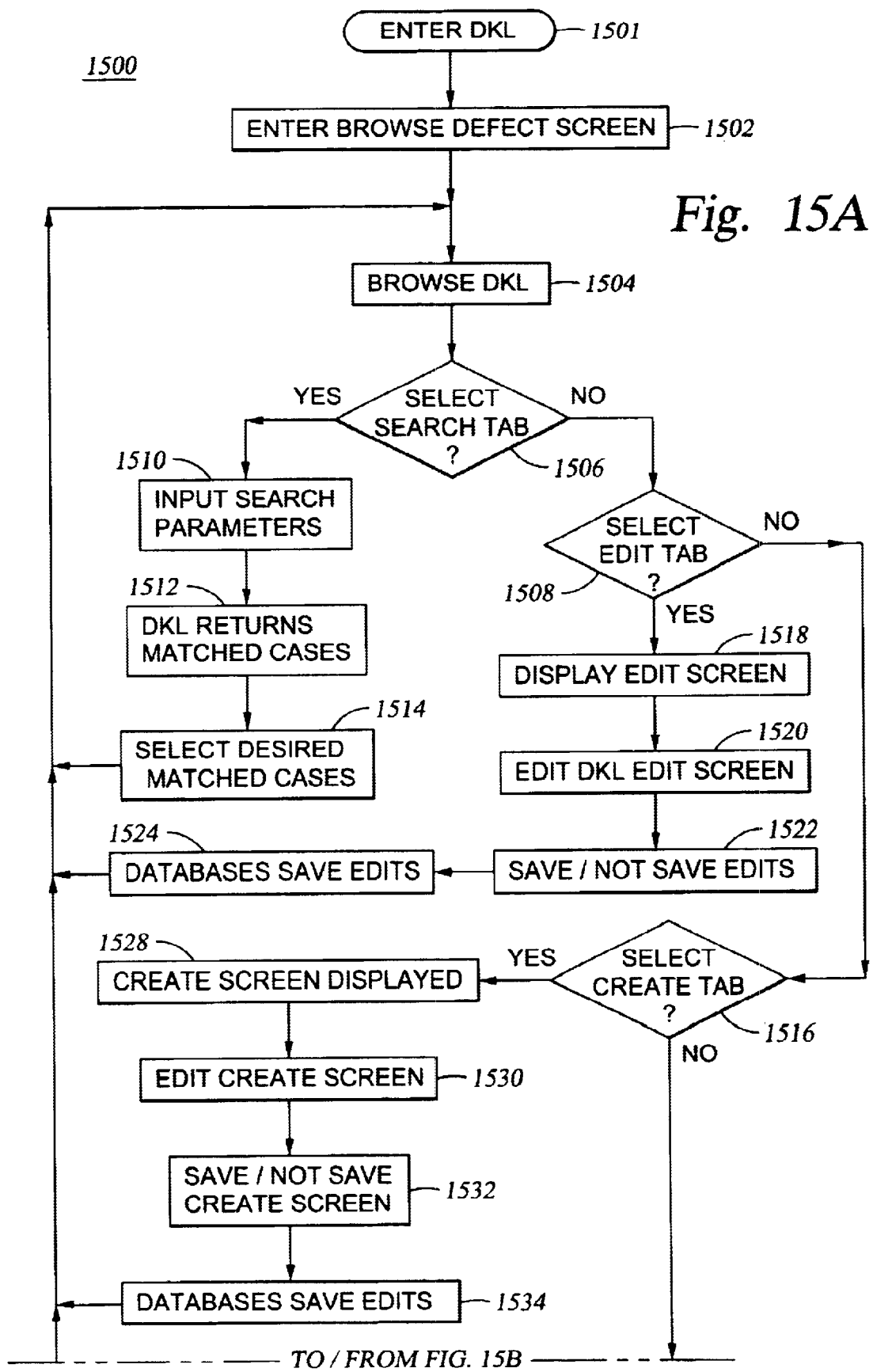
FIG. 15 shows a user-interaction method involving the defect knowledge library database system shown in FIG. 3.
Figure 15B:
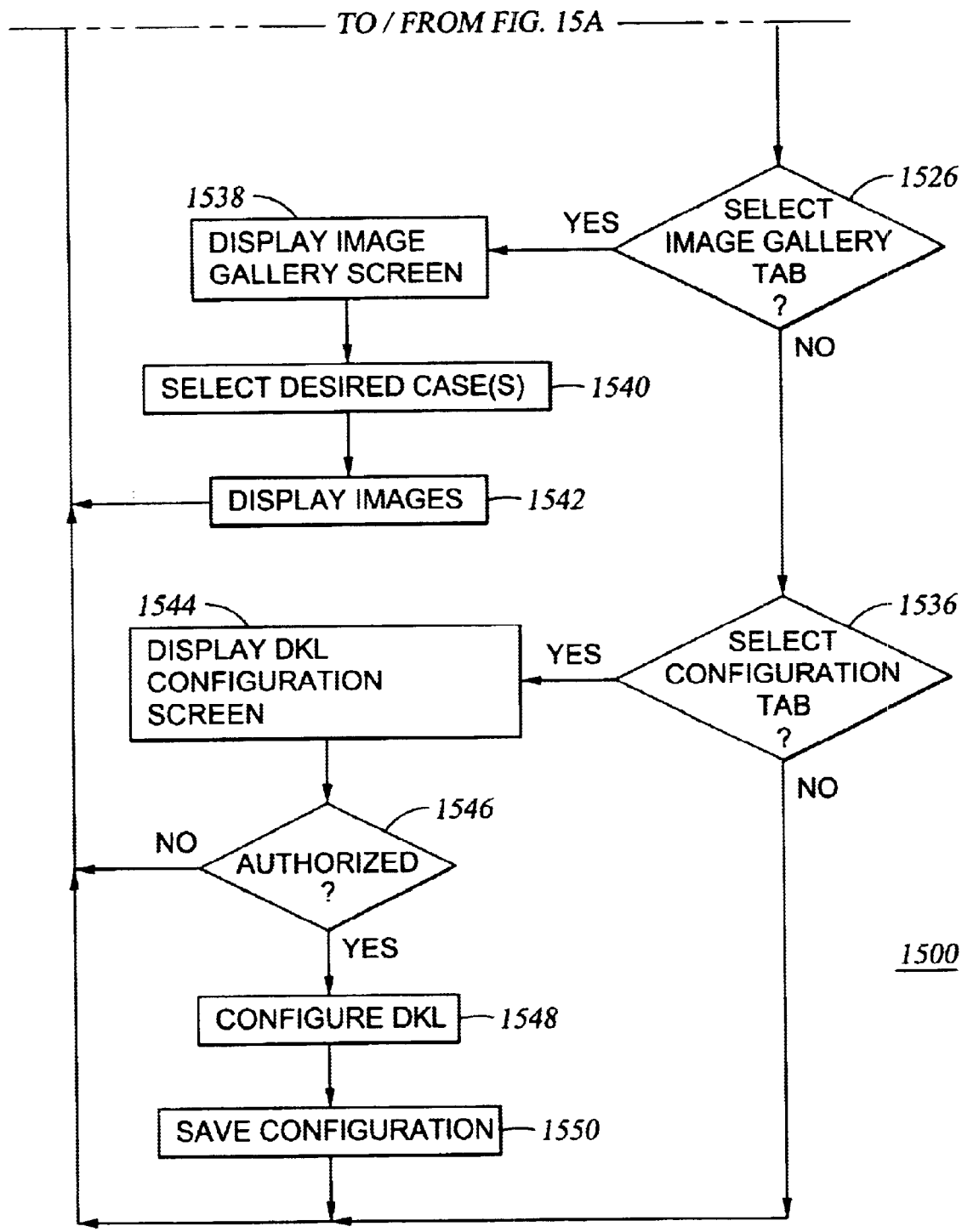

FIG. 15, comprising FIGS. 15A and 15B, depicts a flow diagram of one embodiment of an operational method 1500 for the defect knowledge library database system 186. The method 1500 starts at step 1501 and proceeds to step 1502 wherein the GUI displaying images, data, and/or other information from the defect knowledge library database system 186 initially enters the browse defect screen 700, 900, embodiments shown in FIGS. 7 and 9. The method 1500 continues to step 1504, in which the user browses the defect knowledge library database system using the browse defect screen 700, 900.

The user is provided access to the defect knowledge library database system sites to which he/she has authorization. The method 1500 continues to decision step 1506, in which the user selects the search tab 704, in any of the screens shown in FIGS. 7–14. If the answer to decision step 1506 is no, the method 1500 continues to decision step 1508. If the answer to decision step 1506 is yes, the method 1500 continues to step 1510 which the user inputs search parameters on the displayed search screen 800. In step 1512, the defect knowledge library database system 186 returns all the matched cases that satisfy the search parameters provided in step 1510. The method continues to step 1514 in which the user selects the desired matched cases. After the user selects the desired match cases, the particulars about the matched cases are displayed on the GUI, that re-enters the browse defect screen in step 1502.

Decision step 1508 is in response to the user select the edit tab button 1506 in any one of FIGS. 7 to 14. If the answer to decision step 1508 is no, then the method 1500 continues to decision step 1516. If the answer to decision step 1508 is yes, then the defect knowledge library database system displays the edit screen 1000 in step 1518 as a GUI to the user. The method then continues to step 1520 in which the user edits the defect knowledge library database system edit screen 1000 that is displayed. Following step 1520, the method continues to step 1522 in which the edits to the edit screen 1000 are saved or not saved. The user can select to save the edits by selecting the save button, or the save as button. Alternatively, the user can select to not save the edits and return to the browse defect screen 700, 900 in which instance the cases will remain in the condition they were before the user entered the edit screen. The method 1500 continues to step 1524 in which the defect knowledge library database system 186 saves the edits that are selected as being saved by the user on step 1522. Following step 1524, the method continues to the browse defect screen 700, 900 as shown in step 1502.

If the answer to step 1508 is no, step 1516 will then indicate whether the user wishes to select the create tab 708 in any of the screens shown in FIGS. 7 to 14. If the answer to decision step 1516 is no, then the method 1500 continues to decision step 1526. By comparison if the answer to decision step 1516 is yes, then the method 1500 continues to step 1528 in which the selected create screen 1100 is displayed for the defect knowledge library database system 186. A variety of create screens 1100 may be provided to the user, containing a certain number of fields already completed, or all the suitable fields left blank as desired, and provided by input by the user. Following step 1528, the method 1500 continues to step 1530 in which the user edits the defect knowledge library database system create screen 1100.

In step 1530, the user provides inputs into whatever fields are desired within the create screen 1100, and interacts with the create screen 1100 in a similar manner as the user interacts with the edit screen 1000 in step 1520, as described above. Following step 1530, the method 1500 continues to step 1532 to, in which the edits to create screen 1100 are saved, or not saved. The user may save whichever edits are desired by using the save 1030, or save as 1032 buttons shown in FIG. 10. If the user wishes to delete a screen, they may select delete button 1106 shown in the create screen 1100 in FIG. 11. The method 1500 continues to step 1534, in which the defect knowledge library database system saves the edits as per step 1532. The method 1500 continues following step 1534 to the browse defect screen, as indicated in step 1502.

Provided that the answer to decision step 1516 is no, then method 1500 continues to decision step 1526, which is determined if the user selects the image gallery tab 1610, shown in the embodiments in FIGS. 7 to 14. If the answer to decision step 1526 is no, the method 1500 continues to decision step 1536. If the answer to decision step 1526 is yes, the method 1500 continues to step 1538 in which the image gallery screen 1200, shown in the embodiment in FIG. 12, is displayed. The image gallery screen 1200 displays a case name with a variety of images produced by, e.g., scanning electron microscope process 204, wafer defect inspection process 206, energy dispersive x-ray microanalysis systems and/or other metrology tools 180. The method 1500 continues to step 1540 in which the user selects the desired cases by, e.g., moving up or down on the image gallery screen 1200 as desired, until the desired case is in view on the image gallery screen 1200. The method 1500 then continues to step 1542 in which the images from the metrology tools 180 are displayed. Following step 1542, the method 1500 continues to step 1502 in which the defect knowledge library database system 186 displays the browse defect screen to the user.

Provided the answer in decision step 1526 is no, a method 1500 continues to step 1536 in which is determined if the user selects the configuration tab 712, shown in FIGS. 7 to 14. If the answer to decision step 1536 is no, then the method 1500 continues back to step 1502. If the answer to this is in step 1536 is yes, then the defect knowledge library database system configuration screen 1300, certain portions of which are shown in FIGS. 13 and 14, are displayed as per step 1544.

Following step 1544, the method continues to decision step 1546 in which the defect knowledge library database system 186 determines if the user has appropriate authorization for any desired configuration screen 1300 editing or input. If the answer to decision step 1546 is no, then the users GUI is returned to the browse defect screen as indicated in step 1502. If the answer to decision step 1546 is yes, then the method 1500 continues to decision step 1548 in which the user is allowed to configure any new company, new group, or other information, where the user is also allowed to configure a new metrology tool, a new process toll, a new wafer, or similar configuration information. Following step 1548, the method 1500 continues to step 1550 in which the user configurations input in step 1548 are saved in the memory, e.g., defect knowledge library database system 186. Following step 1550, the method 1500 continues back to decision step 1502.

It is also noted that in method 1500 the user can enter step 1502 at any time by selecting the browse tab 702 in any of the screens in FIGS. 7 to 14. It is envisioned that the defect knowledge library database system 186 will often loop through a decision step and steps following method 1600 depending upon the tab 702, 704, 706, 708, 710 or 712 that is selected by the user.

While foregoing is directed to the preferred embodiment of the present invention, other and further embodiments of the invention may be devised without departing from the basic scope thereof, and the scope thereof is determined by the claims that follow.

What is claimed is:

1. A method of creating a defect knowledge library comprising:

creating a database entry comprising a case study of a specific defect including defect information that comprises one or more defect images; and storing the database entry for subsequent access.

2. The method of claim 1, wherein said database entry is stored in a server.

3. The method of claim 2, further comprising:

supplying information for said case study to said server from at least one client.

4. The method of claim 1, wherein the step of creating the case history comprises:

selecting defect information from at least one metrology tool.

5. The method of claim 4 wherein the metrology tool comprises a scanning electron microscope.

6. The method of claim 1 wherein the step of creating the case study comprises:

providing a cause of the specific defect; and storing the cause within said database entry.

7. The method of claim 6 wherein said database entry is stored in a server that is coupled to at least one client and the cause is provided by the at least one client.

8. The method of claim 6 wherein the step of creating the case study further comprises:

providing a solution to the cause of the specific defect; and storing the solution within said database entry.

9. The method of claim 8 wherein said database entry is stored in a server that is coupled to at least one client and the solution is provided by the at least one client.

10. The method of claim 1 where said database entry comprises a classification code for said specific defect.

11. The method of claim 1 wherein said creating the case study step comprises:

entering defect information using a data organization template.

12. The method of claim 1 wherein said creating the case study step comprises:

selecting said one or more defect images from an image gallery.

13. A method of creating a defect knowledge library that is stored in a server and accessible from a plurality of clients comprising:

gathering defect information, causes of one or more defects in said defect information and solutions to mitigating the one or more defects at one or more of said clients;

coupling the defect information, causes and solutions to the server;

organizing the defect information, causes and solutions in a plurality of database entries; and enabling database entries created by a first client to be accessed by a second client.

14. The method of claim 13 wherein aid enabling step comprises:

restricting access by said second client to sensitive information within said database entries of said first client.

15. The method of claim 13 further comprising:

remotely editing the defect information, causes and solutions stored on the server using a client.

16. The method of claim 15 wherein the editing step further comprises:

establishing security authorization levels to restrict editing privileges of the plurality of clients.

17. The method of claim 13 wherein the defect information comprises at least one image of the defect.

18. The method of claim 13 further comprising:

accessing the server from the plurality of clients via a browser interface.

19. The method of claim 13 wherein the plurality of clients are coupled to the server via the Internet, a local area network or a wide area network.

20. The method of claim 13 wherein the defect information, causes and solutions form a plurality of case studies for specific defects.

21. The method of claim 20 wherein said plurality of case studies are searchable by the clients.

22. A defect knowledge library comprising:

a client tier, supported by a plurality of clients, for providing remote access to a defect knowledge library database;

a middle tier, supported by a server, for providing database access control for each client that is coupled to the client tier; and a data tier comprising the defect knowledge library database that is accessible by each client in the plurality of clients via the middle tier.

* * * * *